United States Patent [19]

Hed

[11] Patent Number: 5,091,361
[45] Date of Patent: Feb. 25, 1992

[54] MAGNETIC HEAT PUMPS USING THE INVERSE MAGNETOCALORIC EFFECT

[76] Inventor: Aharon Z. Hed, 12 Wagon Trail, Nashua, N.H. 03062

[21] Appl. No.: 547,796

[22] Filed: Jul. 3, 1990

[51] Int. Cl.$^5$ .................... H01L 39/14; F25B 21/00
[52] U.S. Cl. .................................. 505/1; 62/3.3; 62/3.1
[58] Field of Search .................. 62/3.3, 3.1; 501/1

[56] References Cited

U.S. PATENT DOCUMENTS

| | | | |
|---|---|---|---|
| 3,108,444 | 10/1963 | Kahn | 62/3.1 |
| 3,393,526 | 7/1968 | Pearl | 62/3 |
| 3,765,186 | 10/1973 | Vassilev | 62/3 |
| 3,841,107 | 10/1974 | Clark | 62/3.1 |
| 4,332,135 | 6/1982 | Barclay et al. | 62/3.1 |
| 4,392,356 | 7/1983 | Brown | 62/3.1 |
| 4,408,463 | 10/1983 | Barclay | 62/3.1 |
| 4,642,994 | 2/1987 | Barclay et al. | 62/3.3 |
| 4,704,871 | 11/1987 | Barclay et al. | 62/3.1 |
| 4,727,722 | 3/1988 | Kirol | 62/3.1 |
| 4,785,636 | 11/1988 | Hakuraku et al. | 62/3.3 |

FOREIGN PATENT DOCUMENTS 0187078  7/1986  European Pat. Off. ............ 62/33

OTHER PUBLICATIONS

"Magnetic Refrigeration: A Review of a Developing Technology", John A. Barclay; Astronautics Corp. of America; pp. 719 thru 731.
"Rotary Recuperative Magnetic Heat Pump"—Lance D. Kirol and Michael W. Dacus; Idaho Nat'l Engineering Lab; pp. 757 through 765.
"An Ericsson Magnetic Refrigerator for Low Temperature", Matsumoto et al; Tokyo Inst. of Technology; pp. 743 thru 750.

*Primary Examiner*—Albert J. Makay
*Assistant Examiner*—William C. Doerrler
*Attorney, Agent, or Firm*—Eliot S. Gerber

[57] ABSTRACT

A heat pump system operates by the inverse magnetocaloric effect in which the working medium is a superconductive body of type II superconductive material having a critical temperature above 23° K. The superconductive body is cooled to below its critical temperature and subjected to a changing magnetic field, which decreases the concentration of paired charged carriers without their complete elimination and induces cooling and/or absorbs heat of the working medium.

52 Claims, 20 Drawing Sheets

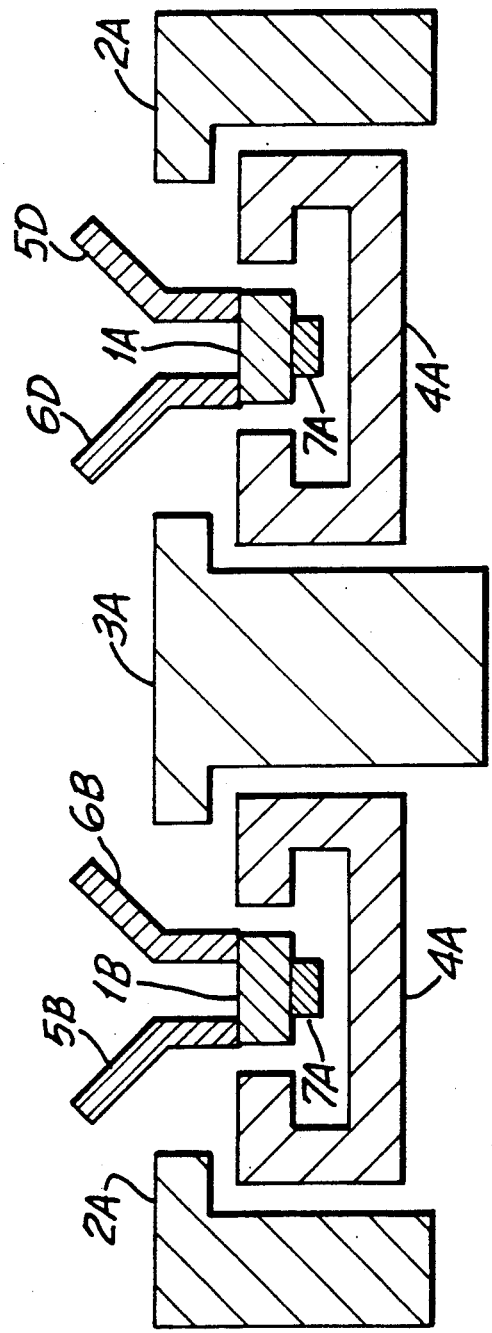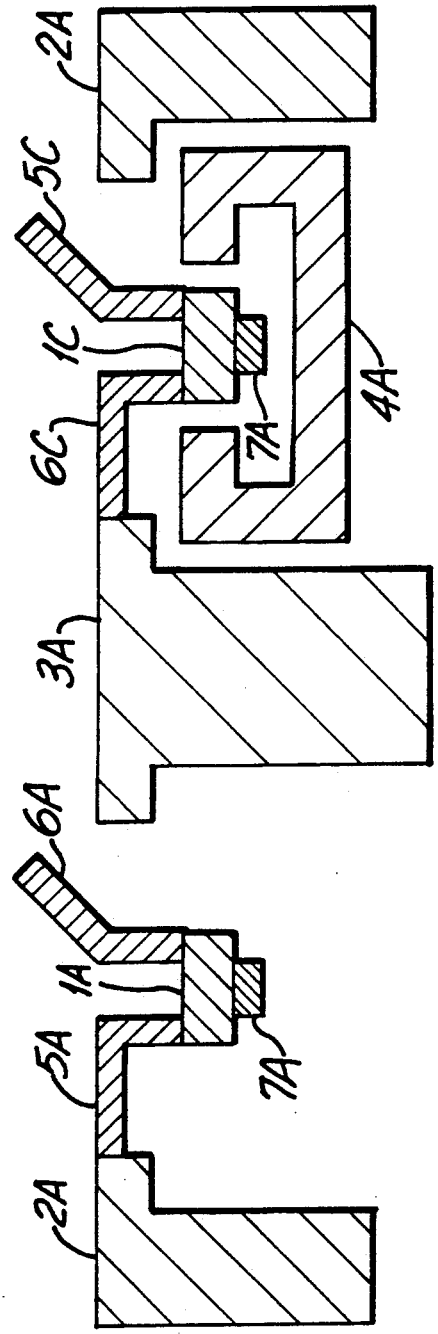

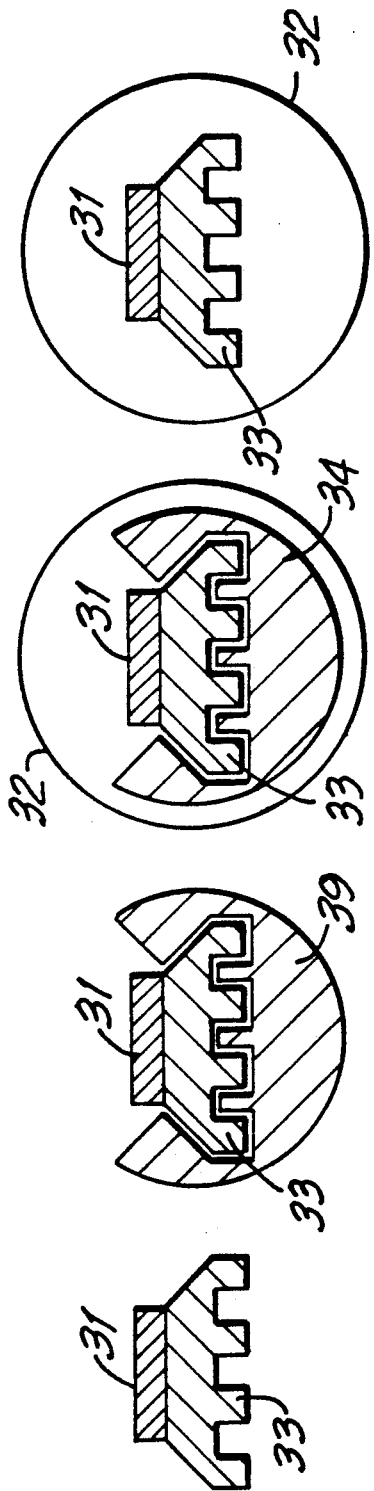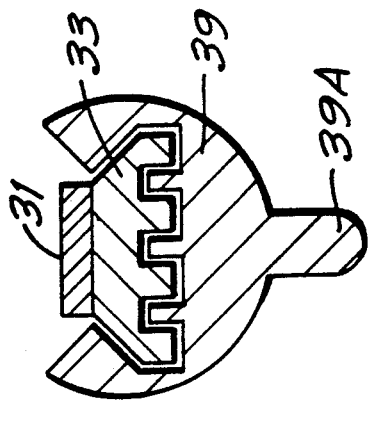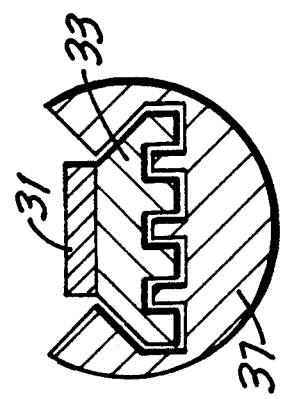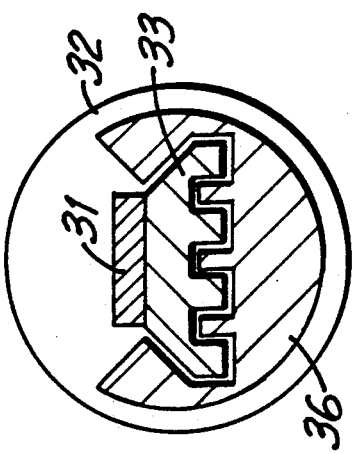
FIG.16A FIG.16B FIG.16C FIG.16D
FIG.16E FIG.16F FIG.16G

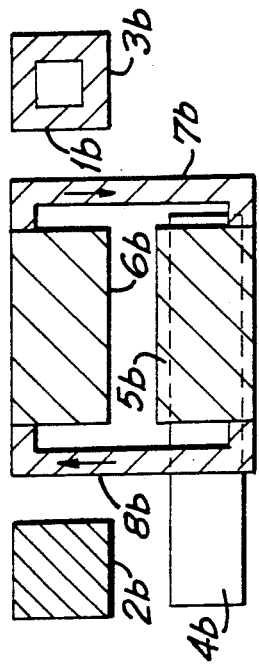
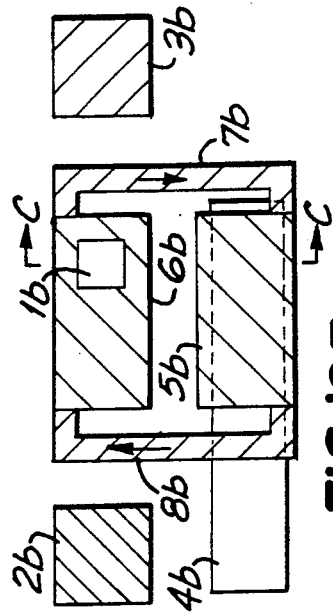
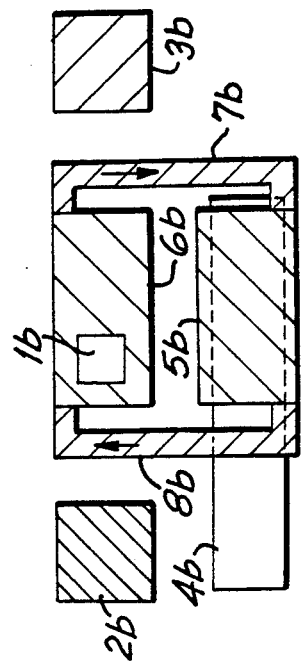
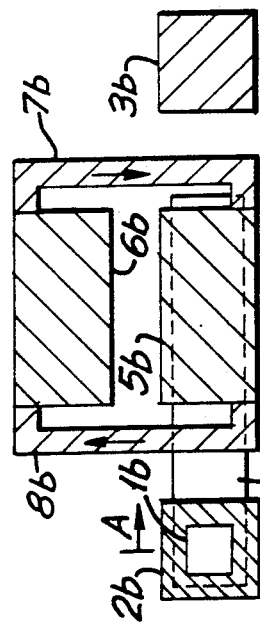
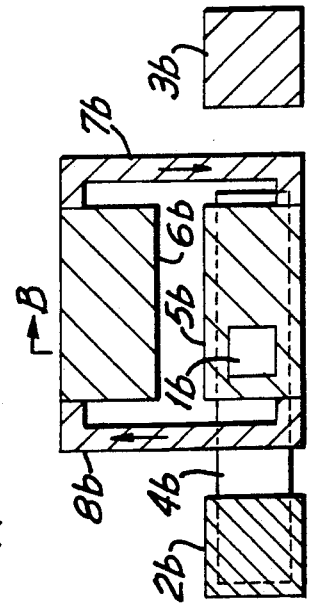
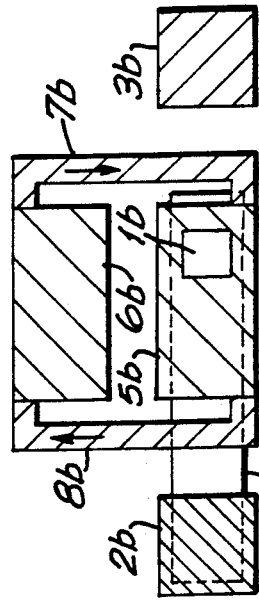

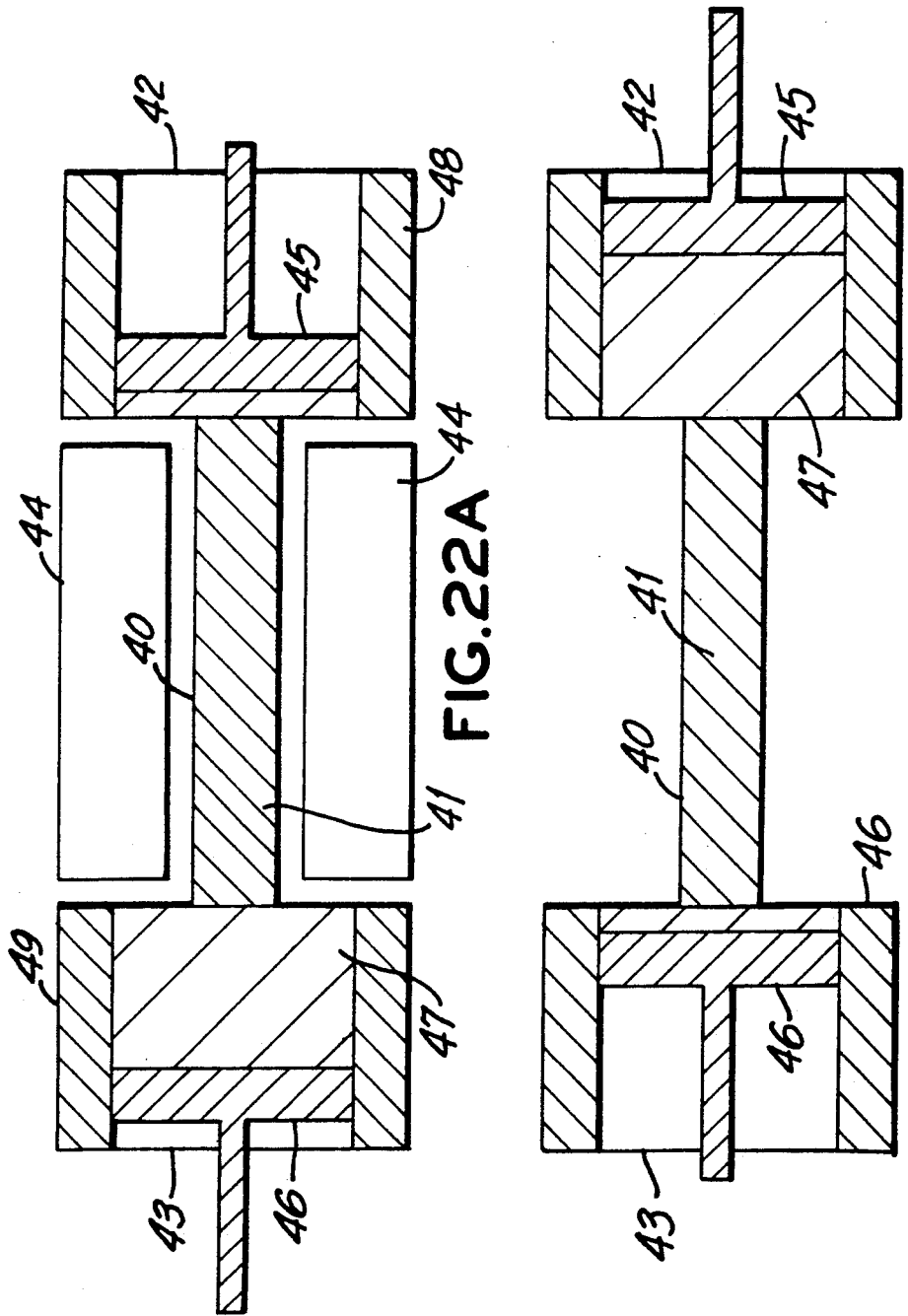

POSITION WITHIN THE FLUIDIZED BED

MAGNETIC HEAT PUMPS USING THE INVERSE MAGNETOCALORIC EFFECT

BACKGROUND OF THE INVENTION

1. Field of the Invention

The present invention relates to magnetic heat pumps and refrigerators and more particularly such magnetic devices used at cryogenic temperatures.

2. Discussion of Related Art

A. Cryogenic Refrigeration

The term "cryogenic region" refers to very low temperature, from absolute zero Kelvin (equal to −273 Centigrade or −459.63° Fahrenheit) to about −330° Fahrenheit, although there is not clear-cut ceiling. The "cryogenic fluids" are substances which are liquid at cryogenic temperatures and include nitrogen (−196° C. - B.P., 77, hydrogen (−253° C. - BP, 20.3° K.) and helium (−269° C. - BP, 4.2° K.). Nitrogen is often used as it is chemically inert and relatively inexpensive.

One type of refrigerator used to obtain cryogenic temperature is the "ADL-Collins Helium Liquefier" in which helium gas is processed through a four-stage compressor (four compressors operate from the same motor). At each stage the heat added by compression is removed with water. The helium gas is then cooled by a series of "heat engines" (expansion engine cycle) in which the gas work in moving a piston and flywheel performs to lower its temperature and pressure.

An alternative type of cryogenic refrigerator uses "magnetic cooling" and "adiabatic demagnetization of paramagnetic material". It may be used to obtain extremely low temperatures, for example, below 4.2° K. A paramagnetic material acts like a magnet when in a magnetic field but stops being magnetic when the field is removed. The process is "adiabatic" as the material does not gain or lose energy when being magnetized and demagnetized. When demagnetized the paramagnetic or ferromagnetic material has its electron spins in disorder, i.e., it has a high degree of "entropy" (in thermodynamics the degree of disorder in a system). In the magnetic field the electron spins of the paramagnetic or ferromagnetic material are aligned and energy is released to the host lattice (the entropy becomes less) raising the temperature of the host lattice, which temperature rise is removed in the Hot Heat Exchanger (HHEX). Conversely, when the magnetic field is removed the electron spins reassume their random state taking energy from the host lattice so that the lattice becomes colder, and the now colder paramagnetic material is brought into contact with the Cold Heat Exchanger (CHEX).

Presently available cryogenic refrigerators, in general, are costly and they may be inefficient and large. The particular disadvantages of magnetic cooling, i.e., magnetic heat pumps (MHP) are discussed below. The general disadvantages of cost, size and efficiency have prevented the use of cryogenic refrigeration in many laboratories, hospitals and industrial facilities where cryogenic temperatures could be beneficially employed.

Refrigeration at above-cryogenic temperatures, for example, at ambient temperature, suffers from the same problems, particularly that of efficiency. For example, home refrigerators, although they may have a theoretical efficiency of about 70%, in practice operate at below 40% efficiency. In addition, they use Freon (TM) or other chlorofluorocarbon gases (CF) which are detrimental to the ozone layer. In that type of refrigerator, the CF gas (refrigerant) is compressed raising its temperature, which is then cooled by air passing over the radiator coils ("condenser") of a HHEX o the back of the refrigerator. The cooled gas, which may become a liquid, generally at ambient (room) temperature and high pressure, passes through a "Joule-Thompson" nozzle (an expansion valve) so that its pressure and temperature drops and it is then circulated through the coils of tubing inside the refrigerator (the "evaporator", a type of CHEX) in which it absorbs heat and is then recirculated.

One of the most important uses of cryogenic temperatures is to cool selected materials so they become "superconductive", i.e., their electrical resistance drops to zero at the materials' "critical temperature". For example, certain older superconductive materials may be formed into a wire which is coiled about a magnet to form an electromagnet, such as a solenoid, or may be used in an electronic device. For example, the alloy niobium-tin is an older superconductive material which becomes superconductive in the 18.5° K. range In the past few years superconductors have been developed which become superconductive at higher temperatures.

B. Magnetic Heat Pumps

Magnetic heat pumps (MHP) have been the subject of extensive study for the last 30 years. In the last few years these developments have resulted in workable and efficient systems, particularly for temperatures below 20° K.

In general, in magnetic heat pumps, a magnetic field is applied and withdrawn relative to a material with paramagnetic or ferromagnetic magnetic properties. There is a transfer of heat between reservoirs at differing temperatures, i.e. between a hot heat exchange (HHEX) and a cold heat exchange (CHEX), which is cooled. When heat extracted from the low temperature heat exchange (CHEX) the device needs input of work, usually physical motion from a motor, and the device is a refrigerator or a heat pump.

While there are a number of theoretical effects in which a magnetic field can be used in a thermodynamic cycle, only the "magnetocaloric effect" (MCE) has been commercially exploited. In the magnetocaloric effect, a paramagnetic or ferromagnetic material is exposed to a very high magnetic field, for example 3–12 Telsa, as a result, electron spins within the material are forced to align. When that occurs, the entropy of the system decreases (the order in the system is higher). When the process is adiabatic, the temperature of the magnetic material rises, and in non-adiabatic processes, heat is exuded to the environment. Conversely, if the material is already under the influence of a strong magnetic field, and this field is removed adiabatically, the electrons' spins reassume random positions taking heat from the lattice, (less order, thus more entropy) and the material' s temperature decreases. When the magnetic field is removed non-adiabatically, heat is absorbed by the magnetic medium.

It has been speculated that the availability of high temperature superconductors will have a major impact on the potential commercial feasibility of such MCE heat pump systems because they will be used in electromagnets to form high magnetic fields with little or no Joule heating losses. However, MCE heat pumps have an intrinsic shortcoming that cannot be remedied with the potential availability of superconductor based extremely high magnetic fields. In the best MCE materials, (usually gadolinium compounds), the maximum temperature lift achievable between the heat sink and heat source is about 20° K. (magnetic field strength required is about 8 Tesla). This is due to the fact that once most of the electron spins have been aligned, saturation sets in and additional increases in the magnetic field do not improve the process.

In theory classical low temperature superconductors may exhibit an "inverse magnetocaloric effect," in which such a superconductor exposed adiabatically to a quenching magnetic field, cools, and when the quenching magnetic field is removed, the superconductor heats up. The entropy of the superconductive phase is always lower than the entropy of the normal phase at the same temperature (the superconductor being quenched to the normal phase by an externally applied magnetic field which is larger than its critical field at that temperature). The difference in entropy is rooted in the fact that in the superconducting phase, the electrons are paired and thus provide a more ordered system. The free energy difference between the two states is actually the sum of the binding energies associated with the coupling of all the electron pairs in the superconductor.

However, the inverse magnetocaloric effect in low temperature classical superconductors is not a practical means of refrigeration for a number of reasons. First, due to the very small binding energy of classical superconductors (at most 3 millielectron volts per pair), the quantity of heat extractable per cycle from the classical superconductors is small. Second, the thermal conductivity of the classical superconductor, in their superconducting phase, is very low, making it difficult to build efficient heat transfer machines. Third, the highest maximum critical temperature possible with the classical superconductors is below 23° K. Furthermore, in an inverse magnetocaloric effect using classic low temperature superconductors, relatively large fields are required to obtain the desired effect, since at least the lower critical field Hcl must be exceeded which is quite high in classical superconductors.

C. Superconductors

Until recently, it was believed that superconductivity above 23° K. was not possible. This belief was rooted in the theoretical work now named the BCS theory (Bardeen, Cooper and Schrieffer) which predicted such a limit. In the context of this invention the term "high temperature superconductor" (called "high Tc material") means any superconductor whose critical temperature is above the limit set by the BCS theory, namely with a critical temperature in excess of 23° K.

In the early 1970's a number of theoretical proposals were presented, suggesting that the critical temperature for superconductivity could be increased above the BCS limit. (V. L. Ginzburg, Usp. Fiz. Nauk. 101, 185 (1970)) (D. Allender, J. Bray, J. Bardeen, Phys. Rev. B8, 4433 (1973)) A significant experimental breakthrough in high temperature superconductivity was provided in November 1986 by Bednorz and Muller (of IBM Zurich) when they published a tentative disclosure of high temperature superconductivity (Georg Bednorz and Alex Muller, Z. Phys. B64, 189 (1986)).

Early confirmation came from Japan in November 1987 where the Meissner effect was reported for high-Tc material. In a second paper for La(2-x)Ba(x)CuO(4-y), a critical temperature above 30° K. was reported (H. Takagi, S. Uchida, K. Kitazawa, S. Tanaka, Jpn. J. Appl. Phys. 26, L123 (1987)).

In the United States, confirmation of a 93° K. superconductivity transition temperature was reported by Chu for yttrium-barium-copper oxide ceramic. (M. K. WU, J. R. Ashburn, C. J. Tang, P. H. Hor, R. L. Meng, L. Gao, Z. J. Huang, Y. Q. Wang, and C. W. Chu, Phys. Rev. Lett. 58, Mar. 2, 1987, p. 908.)

This material was dubbed the 123 or 1-2-3 compound and serves as a model for advanced research in the field.

During 1987 and 1988, a number of families of high temperature superconductors were discovered with confirmed critical temperatures all the way to 162° K. These materials are usually ceramic oxides containing copper, usually in the trivalent state, an alkaline metal (Ca, Sr or Ba) and a rare earth including yttrium.

In later developments the rare earths have been partially, and sometimes completely replaced with bismuth, or combinations of bismuth and lead to yield critical temperatures between 90° K. and 160° K. Similar substitutions with thallium yield another family of superconductors with a similar range of critical temperatures. There are even some scattered unconfirmed reports of superconductivity above 162 ° K. , for instance by R. G. Kulkarui reporting superconductivity in the vicinity of 200° K. , in a mixed spinel oxide having the approximate composition Ca(0.5)Zn(0.5)Fe(2)O(4). Also Ogushi has reported room temperature superconductivity in yet ill defined niobium, strontium, lanthanum oxides. Late in 1989, scientists at Wayne State University (J. T. Chen at al.) have reported superconductivity in a compound related to 1-2-3 at temperatures as high as 240° K.

OBJECTIVES OF THE INVENTION

It is an object of the present invention to provide a magnetic heat pump having an efficiency close to the Carnot efficiency of such a machine.

It is yet another object of this invention to provide such heat pumps operating with large temperature lifts with the help of regenerative or recuperative heat exchangers.

It is a still further object of the present invention to provide for the miniaturization of magnetic heat pumps, particularly for defense and electronics oriented applications.

It is still a further object of this invention, when ambient superconductors become available, to provide superconductor-based magnetic heat pumps in the industrial refrigeration field to replace vapor compression refrigerators, which use chlorofluorocarbons, which should be eliminated due to their adverse impact on the ozone layer in the upper atmosphere.

It is still a further objective of the present invention to provide magnetic heat pumps whose efficiency (as a percentage of Carnot efficiency) is higher and less dependent on thermal loading than the actual efficiency of vapor compression devices. Theoretical vapor compression devices operate at about 60% to 70% of Carnot efficiency, but in practice, rarely exceed 35% of Carnot efficiency particularly under variable loading.

It is still a further object of the present invention, relative to classical magnetocaloric based magnetic heat pumps, to use high magnetic fields at the lower temperature part of the thermodynamic cycle, rather than at the high temperature part as in the classical MCE devices.

SUMMARY OF THE INVENTION

In accordance with the present invention there is provided a magnetic heat pump in which the working magnetic medium is a high temperature Class II superconductor. The magnetic heat pumps operate on the principle of the "inverse magnetocaloric effect" in which the entropy of a high temperature superconductor is changed by the application and withdrawal of external magnetic fields. When the magnetic field application is adiabatic, cooling of the working superconducting medium occurs, and the working medium is then allowed to draw heat from a low temperature source (CHEX). When the external magnetic field is now removed adiabatically, the temperature of the superconducting medium rises and the now warmer medium is put in contact with a high temperature sink (HHEX) where the heat taken from the lower temperature source is rejected. The thermodynamic efficiency of the magnetic heat pump depends upon the details of the thermodynamic cycle used, including magnetic field application and withdrawal, the heat exchange with the low and high temperature sources and sinks, when they are used, and the nature of the regenerative or recuperative heat exchange. The instant invention discloses a number of embodiments illustrating different magnetic cycles, and different applications of these cycles. In the preferred embodiments, the magnetic fields used in the various embodiments are created by persistent currents in fixed superconducting solenoids which are either linear or segments of a toroid. In some embodiments, the superconducting working medium is moved laterally and reciprocally in and out of localized magnetic fields and in other embodiments the magnetic field creating device is moved to the fixed location of the working medium. In yet another embodiment, the working medium (the ceramic high temperature type II superconductor below its critical temperature) is located on a ring that rotates continuously in and out of the magnetic field created inside a segment of a toroid. In yet another embodiment, the working medium and the magnetic field are moved both relative to each other.

PREFERRED EMBODIMENTS OF THE INSTANT INVENTION

I. Thermodynamic Theory of Operation

This invention relates to magnetic refrigerators and heat pumps in which the working magnetic medium is a type II high temperature superconductor whose critical temperature $T_c$ is over 23K. The working superconductor medium ("WSM") is cycled into and out of magnetic fields in such a manner that the working media absorbs heat at a low temperature and rejects the heat at a higher temperature. The work of moving the working media against an increasing magnetic field is provided by mechanical means, for example a motor. The magnetic field gradient encountered at the entrance and exit of the magnetic field exercises a repulsive or attractive force on the superconductor body, and the work is provided to counteract this force.

The basic principles of this invention is illustrated in FIG. 1, a schematic diagram of the Temperature (T) vs Entropy (S) in a working magnetic medium, in this case a high temperature superconductor, for different applied magnetic field intensities.

BRIEF DESCRIPTION OF THE DRAWINGS

In the accompanying drawings:

FIGS. 12A and 12B are cross-sectional views of another embodiment;

FIGS. 16A-16G are cross-sectional views of the embodiment shown in FIGS. 14 and 15;

FIGS. 18A-18F are cross-sectional views of another embodiment;

FIGS. 22A, 22B are cross-sectional views of the device of FIG. 21A; and

Referring to FIG. 1, the point B denotes the critical temperature of the superconductor at zero applied magnetic field. At this point the entropy of its normal and superconducting phases are equal. At the point 0, the temperature is 0° K. and the entropy of both the normal and superconducting phases are equal. The curved line OIGECBA, represents the T,S relationship for the normal (non-superconducting phase) of the superconductor medium or when the applied magnetic field is larger than $H_{c2}$, the field at which the superconductor is forced completely into its normal phase. For increasing temperatures the value of $H_{c2}$ declines monotonously, until at the critical temperature $(T_c)$, point B on FIG. 1, $H_{c2}=H_{c1}=0$. The T,S relationship for the purely superconducting phase, when the Meissner effect is complete, is given by the line OJHFDB. This relationship applies for all magnetic fields that are smaller than $H_{c1}$, which like $H_{c2}$ is a declining function of the increasing temperature.

The working range of the magnetic heat pumps of the instant invention is between these two lines (between OIGECB and OJHFDB). In classical low temperature superconductors, the crescent shaped area created between these two lines is extremely narrow, and combined with the extremely low thermal conductivity in their superconducting phase, made impractical the application of the inverse magnetocaloric effect associated with the application of a magnetic field to classical superconductors. However, in high temperature superconductors, the width of the aforementioned crescent is quite appreciable. Unlike low temperature superconductors, the high temperature Class II superconductors have thermodynamically stable positions within the crescent, particularly within the inner crescent formed between the lines OIGECB and OKLMNB. In Class I, superconductors, due to the Meissner effect, the superconductor body is not penetrated by a magnetic field, but in Class II superconductors, a magnetic field will penetrate the superconductor body when it is below its critical temperature.

Figure 1:
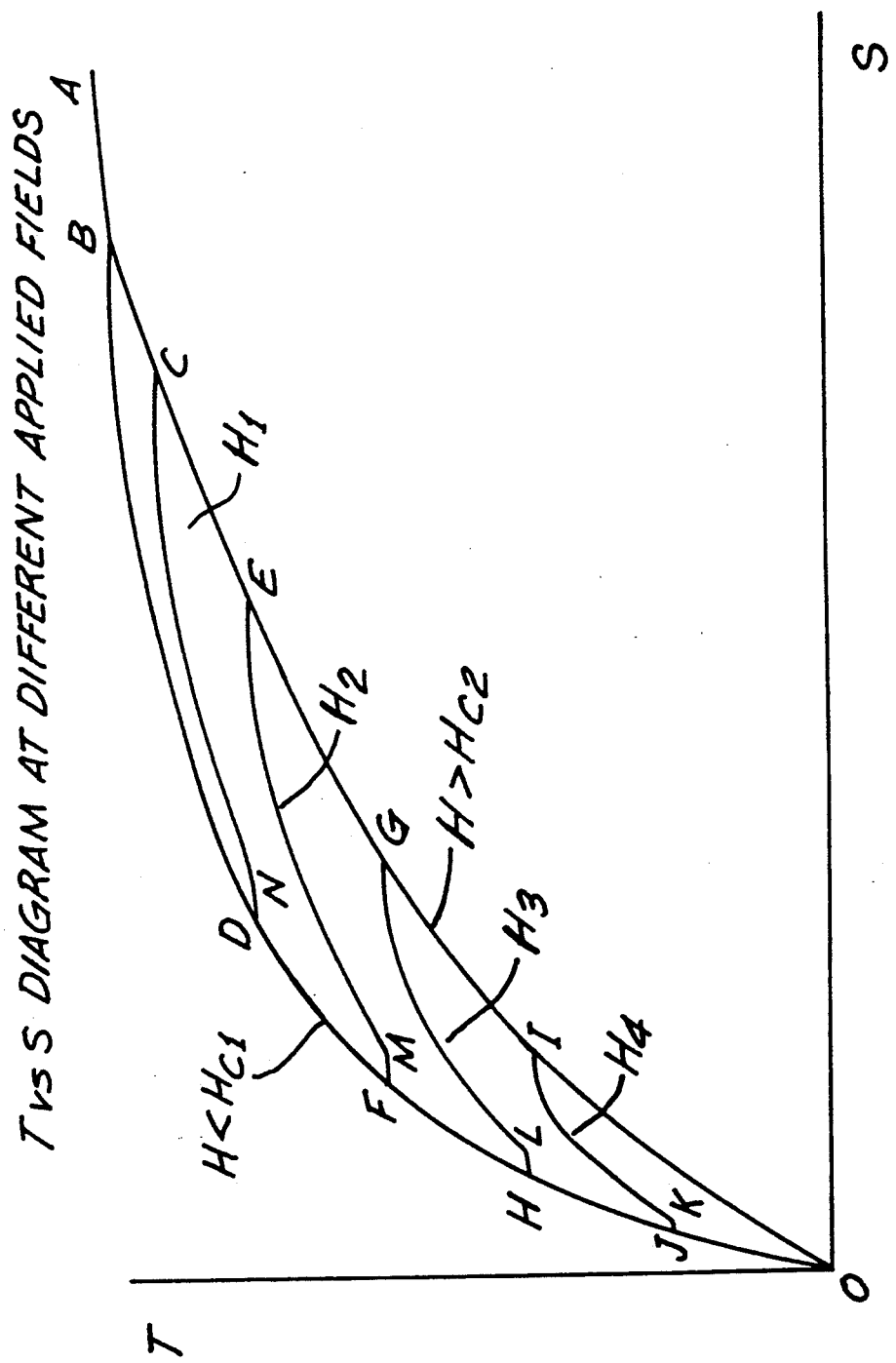
FIG. 1 is a graph of T (Temperature) v. S (Entropy)

In FIG. 1, the impact of imposed magnetic fields on the T, S diagram of the working media, is described by the lines marked respectively $H_1$, $H_2$, $H_3$ and $H_4$. $H_1$--$H_4$ are four magnetic fields of different strengths, for example $H_1$ is 0.1 Tesla, $H_2$ is 0.5 Tesla, $H_3$ is 2 Tesla and $H_4$ is 10 Tesla. The fields $H_1$–$H_4$ represent the T, S behavior within the working range crescent at progressively increasing fixed magnetic fields applied to the superconducting working medium. For an applied magnetic field $H_1$ the T, S relationship follows the line OJHFDNCBA. In the segment OJHFD, the medium is purely diamagnetic, namely the Meissner effect is complete and there is no penetration of the magnetic field within the working medium. When the temperature reaches $T_D$, the magnetic field $H_1$ is exactly $H_{c1}(T_D)$, the entropy rapidly increases (and dS/dT at this point is for all practical purposes infinite) to $S_n$, where the medium is in the mixed state. As the temperature continues to increase, more and more of the medium is driven into its normal phase and thus a further increase in entropy is observed. At the point C, the medium is completely normal, since $H_1$ is exactly $H_{c2}$ or $H_c(T_c)$, and from C the entropy follows the normal medium entropy line CBA. Similar lines are drawn for progressively higher magnetic fields $H_2$, $H_3$ and $H_4$. The entropy is magnetic field dependent only within the crescent mentioned above, and for fields under $H_{c1}$ the entropy is field independent and follows the pure superconductor line OJHFDB. For fields above $H_{c2}$ the entropy is field independent and follows the line OIGECB. A minor field dependence of entropy in the superconducting and normal states (below $H_{c1}$ and above $H_{c2}$) can exist, however, this is a very small effect relative to changes in entropy within the crescent described here. The source of the field dependence outside the crescent is the interaction with the magnetic field of quasi-particles at any state (normal or superconducting). This interaction is very small, at least to fields as high as half the paramagnetic limit of the superconductors, which for $T_c=120°$ K., could be in excess of 100 Tesla (Clogston's rule).

The T, S diagram presented in FIG. 1, may be compared with similar diagrams for classical low temperature superconductors, which have a much narrower crescent. In addition, low temperature type I superconductors have no stable state within the crescent. In addition, at very low temperatures, the thermal conductivity of low temperature superconductors is very low (for example as low as 100 times less the equivalent normal state at 1/10 of $T_c$) thus making heat exchange with the superconductive phase difficult. This is due to the fact that charge carriers are the major carriers of thermal energy along thermal gradients at very low temperatures. These charge carriers are decoupled (energetically) from the lattice, and thus cannot accept or give energy to the lattice. At higher temperatures, above about 24° K., lattice contributions to thermal conductivity are much higher, thus the charge carrier thermal conduction is less important. Even if some of the charges are decoupled from the lattice (being part of the superconducting liquid electron phase with a single energy level), the impact on thermal conductivity between the normal and superconductive state is minimal. In practice, the thermal conductivity of the normal and superconducting phases of the high temperature superconductors is about the same (within 20% of each other).

There is a major difference between the magnetic heat pumps of the present invention and the magnetic heat pumps of the prior art. Magnetic heat pumps of the prior art are based on the "magnetocaloric effect" in which adiabatic application of a magnetic field on the paramagnetic or ferromagnetic working medium causes the medium's temperature to rise, and the adiabatic demagnetization of the medium causes its temperature to fall. This effect is termed "adiabatic demagnetization cooling". In the instant invention the adiabatic application of a magnetic field on the working medium (a high temperature type II superconductor) causes its temperature to fall, while adiabatic demagnetization of the working medium causes its temperature to rise. This effect is called herein "adiabatic magnetization cooling", and the associated caloric effect an "inverse magnetocaloric effect".

Surprisingly, when very high magnetic fields are applied to a typical high temperature superconductor (for instance a 1-2-3 ceramic having a critical temperature of 92° K.), to quench the superconductor to its normal state, the inverse magnetocaloric effect can cause cooling of more than 20° K. The physical law of corresponding states (of different superconductors) would have implied at most 6° to 7° K. cooling, since a critical temperature of 92° K. is four times the critical temperature of a classical 23° K. superconductor where the binding energy is only 3 millielectronvolts, thus a binding energy of about 12 millielectronvolts would be expected.

I have postulated that this larger than expected cooling effect is due to the presence of a "virtual critical temperature" in high temperature superconductors that is a much higher temperature than the measured critical temperature. This theoretical "virtual critical temperature" for example could be as high as 360° K. for a 1-2-3 superconductor, whose measured critical temperature is only 92° K. The law of corresponding states stays intact when this new "virtual critical temperature" is used. I find from optical measurements that it appears that the binding energy of the charge carriers is much larger than the expected 0.012 electronvolt and is close to 0.050 electronvolt. Calculating the cooling effect expected with this new binding energy I found that the results yield a cooling potential around 20° K.

Consider for example the 1-2-3 compound. The specific heat at 80° K. has been reported to be about 105 Joules/mole/degree ° K. (molar weight 666 grams). If I assume conservatively that only ⅓ of all the copper cations contribute charges (actually holes) to the superconducting condensed charge carrier phase, to provide about $6 \times 10^{23}$ charge carriers per mole (each mole contains 3 moles of copper).

The heat taken from the lattice upon decoupling a pair of charge carriers is equal to their binding energy divided by two. Such decoupling is a decrease in the concentration of paired charge carriers in the lattice of the superconductor body. Taking the binding energy at E=0.05 electronvolt, the thermal transfer of energy from the lattice to decoupling pairs is (adiabatic magnetization):

$$Q = NE/2 = 3 \times 10^{23} * 0.05 * 1.6 \times 10^{-19}) = 2400 \text{ Joules/mole}$$

Since the specific heat is about 100 Joule/mole, a first approximation yields a temperature drop potential of 24° K. per cycle. This calculation took the specific heat and band gaps values at about 80° K. If these high temperature superconductors behave somewhat similarly to most materials, the specific heat will decrease with temperature and the band gap will increase with decreasing temperatures making the aforementioned value even greater at lower temperatures.

Furthermore, if the law of corresponding states is used as a guideline to forecast the binding energy of charge carriers in superconductors with higher critical temperatures, it is not unreasonable to expect much larger band gaps and thus larger temperature lifts. With superconductors having critical temperatures at about 140° K., lifts of about 50° K. are not inconceivable. If ambient superconductors are found, lifts of about 70° K. could be conceived (I did not double the value because of the negative impact on lift of increasing specific heat with temperature which is only partially offset with increased binding energies), which would make such devices acceptable for industrial refrigeration and heat pumping, and possibly consumer products (home and car refrigeration).

These calculations assume a pure magnetic refrigerator or heat pump in which the magnetic medium is magnetized or demagnetized adiabatically, as in a Carnot cycle. In practice, higher temperature lifts are possible, particularly when using cycles that are less efficient than the Carnot cycle, absorption and rejection of heat can be accomplished at a temperature differential which is larger than the pure thermodynamic lift suggested by the calculations given above. However such larger temperature lifts involve thermodynamic less efficient systems and the use of recuperation or regeneration heat exchange systems. The highest feasible heat rejection temperature is fixed in the instant invention by the critical temperature Tc of the superconducting working medium.

The high temperature superconductors of the present invention are particularly suited since their Landau parameters (determining in essence the ratio $H_{c2}/H_{c1}$) is uniquely large. This provide for very $H_{c1}$, as low as 100 gauss with polycrystalline 1-2-3 at 77° K. and a wide range of magnetic fields between $H_{c1}$ and $H_{c2}$ in which the device is operative. $H_{c2}$ can reach 3 Tesla at 77° K. in some high quality 1-2-3 samples.

Unlike in many other applications of high temperature superconductors, ultra-high quality bulk superconductors are not absolutely necessary for the embodiment of the instant invention. Since relative ease of quenching to the normal phase is desirable, the very short coherent length of the pair carriers is not detrimental, and since no high currents are required in the working media, pinnig of fluxons is not particularly desired either. Consequently the superconductive bodies (working superconducting medium "WSM") may be relatively inexpensive and easily fabricated.

II. HEAT PUMP EMBODIMENTS USING THE INVERSE MAGNETOCALORIC EFFECT

A. Carnot magnetic cycle

Figure 2A:
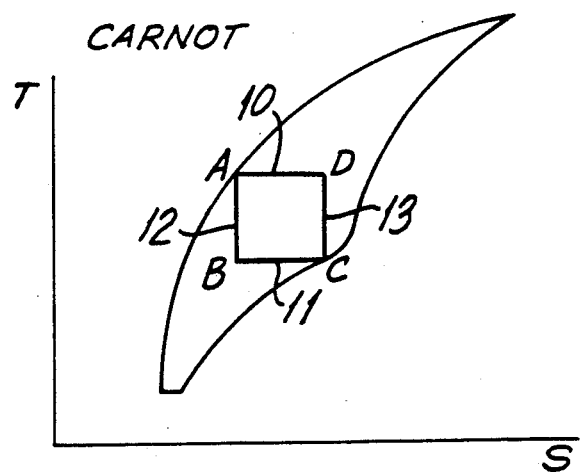
FIGS. 2A, 2B and 2C are T vs. S graphs for the Carnot, Brayton and Ericcson cycles respectively.
Figure 2B:
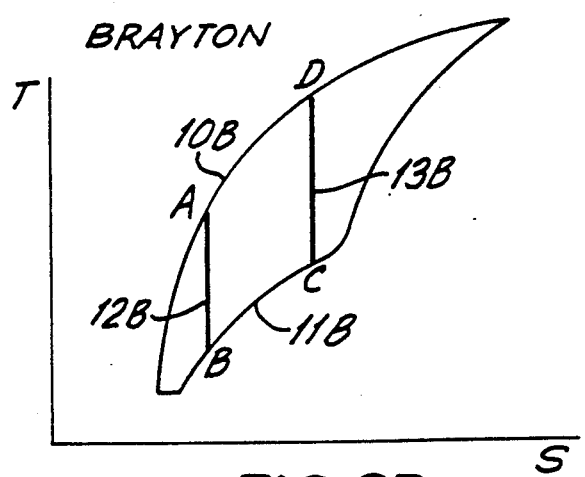

A Carnot magnetic cycle, in which the refrigerator (or heat pump) operates on two isothermal lines 10 and 11 and two isentropic lines 12 and 13 (see FIG. 2A) is theoretically the most efficient. In traditional magnetic heat pumps, this cycle yields very small temperature lifts, for example 5° K., and thus cascades of machines need to be employed. In magnetic heat pumps of the instant invention, where the working medium is a high temperature superconductor, due to the very strong field dependence of the entropy within the mixed state, temperature lifts around 20° K. are possible with a single stage, so that the heat pump may be relatively smaller, less costly and more efficient.

Figure 3A:
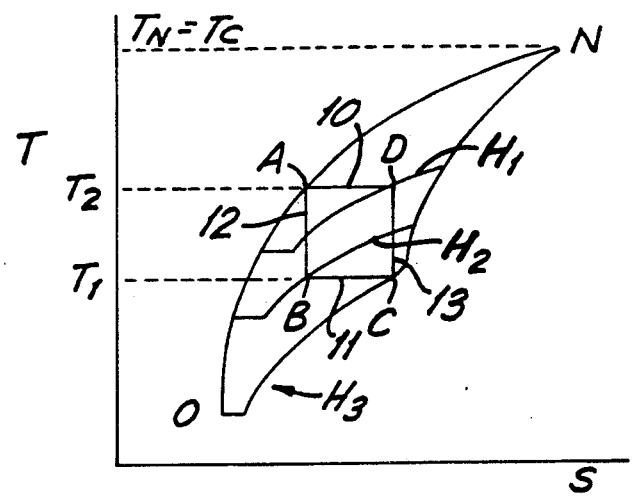
FIGS. 3A-3C are additional T vs. S graphs.
Figure 3B:
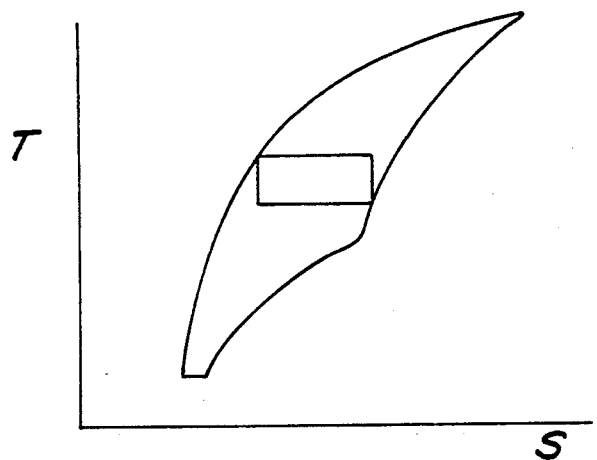
Figure 3C:
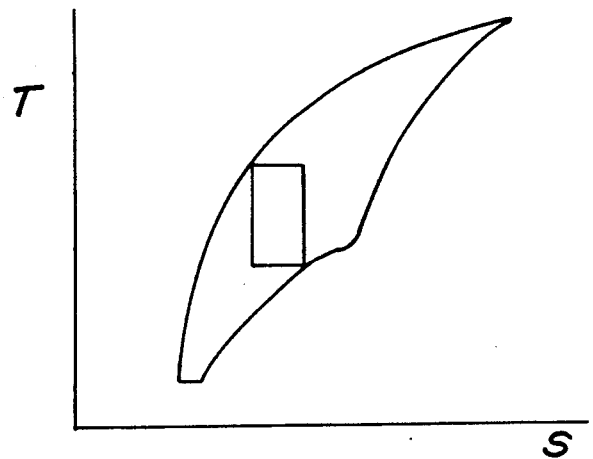
Figure 4A:
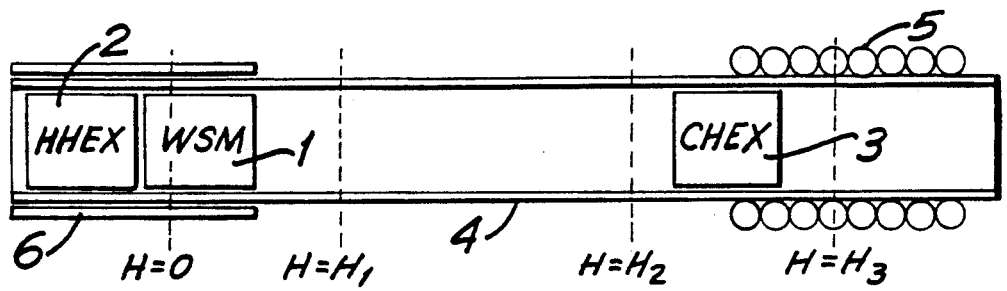
FIGS. 4A-4D are side cross-sectional views of the first embodiment.
Figure 4B:
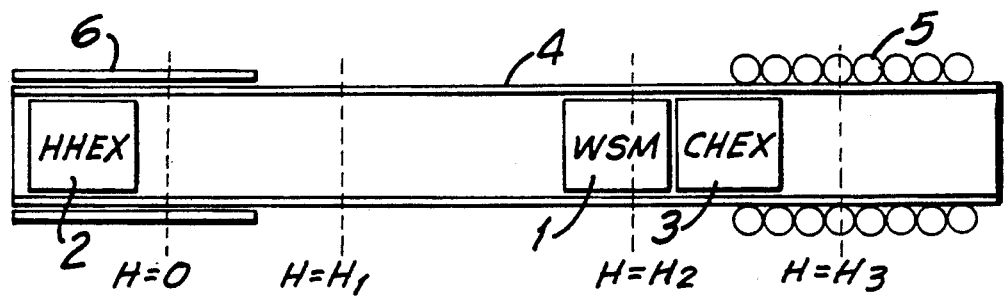
Figure 4C:
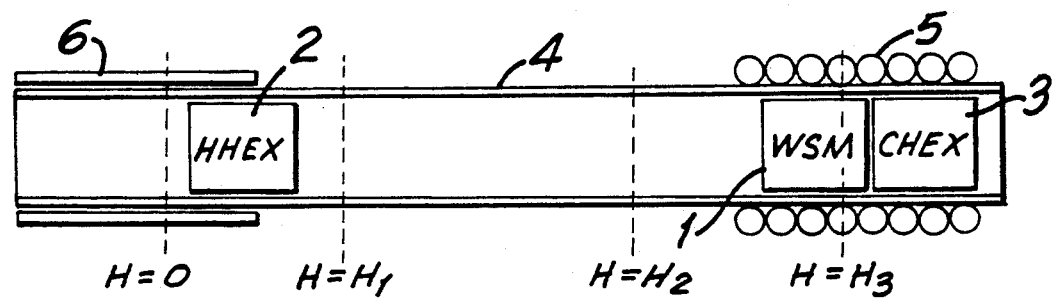
Figure 4D:
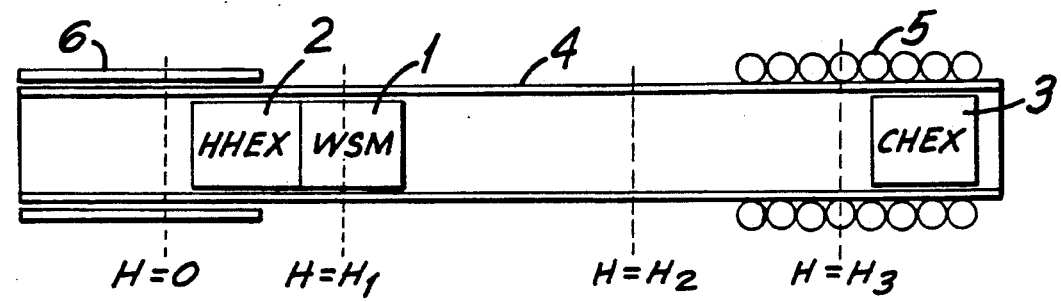

FIG. 3, illustrates a variety of magnetic Carnot cycles in which the working magnetic medium is a high temperature type II superconductor, all these cycles having the same heat rejection temperature, $T_2$. The actual cycle used in a specific heat pump embodiment will depend on the nature of the superconductor and the rate of heat transfer from the load (CHEX) to the superconductor and from the superconductor to the hot reservoir (HHEX). FIG. 3A shows a cycle where the maximum applied field is the high critical field at the low temperature of the cycle $Hmax = H_{c2}(T_1)$ FIG. 3B shows a cycle involving the quenching of the superconductor all the way through the mixed phase to the normal phase. FIG. 3C shows a very large temperature lift, feasible if the heat transfer rates mentioned above are quite high. For simplicity, the following description uses the cycle described in FIG. 3A, but it should be understood that Carnot magnetic heat pumps having high temperature superconductors as their working media, are equally feasible with cycles as described in FIGS. 3B and 3C.

Referring back to FIG. 3A, there is shown only that part of the T, S diagram which includes the working range of the heat pump of the instant invention. N is the point where the working medium becomes normal at zero applied magnetic field, $T_n$ thus equals $T_c$. O is the lowest point (in terms of T and S) where the highest magnetic field employed in the operation of the heat pump ($H_3$) of the instant invention causes entry of the working medium into the mixed state. Therefore at $T_o:H_3 = H_{c1}(T_o)$ Along the curved line OAN, the working medium is purely diamagnetic, while along the curved line CN the working medium is normal. Within the area bordered by the curved lines OAN OC and CN and including the line OC, the working medium is in the mixed state.

The magnetic Carnot cycle based heat pump of the instant invention operates between two isentropic lines 12 and 13 (AB and CD) and two isothermal lines 10 and 11 (BC and DA). The hot heat exchanger (HHEX) is at $T_2$ (line 11) and the cold heat exchanger (CHEX) is at $T_1$ (line 10). In FIG. 3A, we chose the point C to be at the transition between the mixed and normal state for $T_1$. It should be clear however, that the heat pump of the instant invention could operate with its C point within the mixed state or the normal state of the working medium as well (see FIGS. 3B and 3C). The choice of the actual working path depends mainly on the temperature differential required ($T_2$-$T_1$), the highest field available ($H_3$) and optimization of heat rejection per cycle. Since the cycle is a Carnot cycle, the thermodynamic efficiency depends only on $T_2$ and $T_1$ which defines the temperature "lift" for this cycle.

FIG. 4, shows the four basic steps of the Carnot cycle of FIG. 3A used in a heat pump of the instant invention.

In this example, the working superconductor medium (WSM)1, for example is a block of 1-2-3 ceramic high Temperature type II superconductive material. It consists of a solid cylindrical block that is moved inside a hollow tubular cylinder 4 between a cold heat exchanger (CHEX)3 and a hot heat exchanger (HHEX)2. Preferably the WSM1 has bores that mate, with low friction, with protrusions in the HHEX and CHEX so as to improve the heat exchange between these bodies. These are shown in more detail in FIG. 5, detailing one embodiment of the WSM.

The CHEX 3 (whose details can be seen in FIG. 6) is positioned inside a high magnetic field superconducting solenoid 5, which operates in the persistent mode and produces, for example 0.1-15 Tesla. The CHEX is moved within the cylinder 4 between the rightmost side of the solenoid to just outside of the left side of the solenoid, as seen in FIG. 4. The HHEX 2 is moved from the left of a point where the containing cylinder is enclosed within a superconducting cylinder 6 to a point on the left side of the solenoid (this cylinder assures a nil magnetic field within it).

The linear distance between the two heat exchangers is constant, therefore they are preferably mechanically moved in tandem (but kept isolated from each other thermally), or alternately, the superconducting solenoid and the superconducting screen are moved in tandem (as described in more details in FIG. 8). For example, the CHEX 3 and HHEX 2 are connected to a two-armed armed yoke which is reciprocated (oscillated) sidewise at 5 HZ.

The magnetic field distribution has four distinct field strengths (see FIG. 4), monotonously increasing from $H=0$, inside the screening superconducting cylinder 6, through $H_1$ just to the right of the screening superconductor, $H_2$ just to the left of the solenoid 5 and $H_3$ in the middle of the solenoid. As above these fields obey the relationship $H_1 < H_2 < H_3 < H_4$. For example $H_1 = 0.2$ Tesla, $H_2 = 1$ Tesla and $H_3 = 4$ Tesla.

At the first point of the cycle (point A on the T,S diagram in FIG. 3A and part A of the FIG. 4), HHEX 2 is in thermal contact with the WSM 1, both within the region enclosed by the external superconducting cylinder 6 thus screened from any magnetic fields. At this position $H=0$ and $T=T_2$. CHEX 3 has been moved to its position outside the solenoid.

From A to B of FIG. 4 (see FIG. 3A), the WSM 1 is moved adiabatically to where the magnetic field is $H=H_2$, and WSM 1 is brought in contact with CHEX 2 (actual contact occurs only after adiabatic cooling has occurred in WSM). Due to the adiabatic increase in the magnetic field during the path AB (FIG. 3A) decoupling of charge carriers occurs, thus cooling the WSM 1 to the cold temperature $T_1$.

From B to C of FIG. 4 (see FIG. 3A), the WSM 1 is physically moved while in contact with CHEX 3 deep into the magnetic field $H=H_3$, from solenoid 5, which is the $H_{c2}@T_1$ for the superconductor of the WSM. As the magnetic field is increased from $H_2$ to $H_3$, further charge carriers decoupling occurs, so that heat is absorbed by the WSM isothermally ($T=T_1$), since during the path BC (FIG. 3A) the WSM 1 is in contact with CHEX 3 (FIG. 4).

From Part C to D of FIG. 4 (see FIG. 3A), the WSM 1 is moved adiabatically back to the left, where the magnetic field is $H=H_1$. ($H_1 < H_2$)

As the superconductor of the WSM 1 returns to the mixed state in the adiabatic path CD (FIG. 3A) heat is released to its lattice, by the coupling of charge carriers and the superconductor lattice warms up to $T_2$.

At the point D (FIG. 3A) the WSM 1 achieves thermal contact with HHEX 2 and from D back to A, the couple WSM-HHEX is moved back inside the superconducting screen 5, where further decrease in the magnetic field increases the number of paired carriers, thus heat is released isothermally in the path DA, from WSM 1 to HHEX 2. (see part D of FIG. 4).

The Carnot cycle magnetic heat pump described in FIG. 4, is termed a "double reciprocating heat pump," in that two reciprocating movements are involved, the first is the movement back and forth of the WSM 1 and the second is the movement back and forth of the pair of heat exchangers (CHEX 2 and HHEX 3).

Figure 5A:
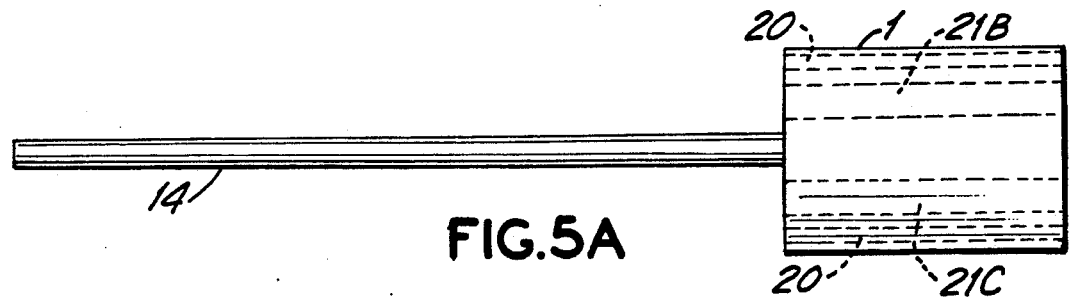
FIGS. 5A and 5B are side and front views, respectively, of a second embodiment.
Figure 5B:
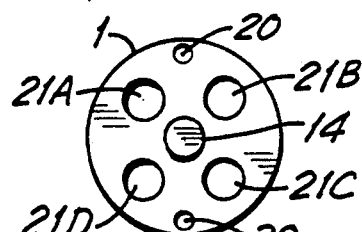

FIG. 5 shows details of an embodiment of the WSM 1 of the instant invention described in FIG. 4. A thermally insulating shaft 14 is connected to the WSM 1 and serves to move the WSM along the Tube 4. Two guide holes 20 pass through the WSM 1 through which the two heat exchangers (HHEX 2 and CHEX 3) are connected to each other. The four round right-cylindrical bores 21A-21D make slide contact with boss protrusions in the two respective heat exchangers CHEX 2 and HHEX 3 to improve the heat transfer between the WSM 1 and those heat exchangers.

Figure 6A:
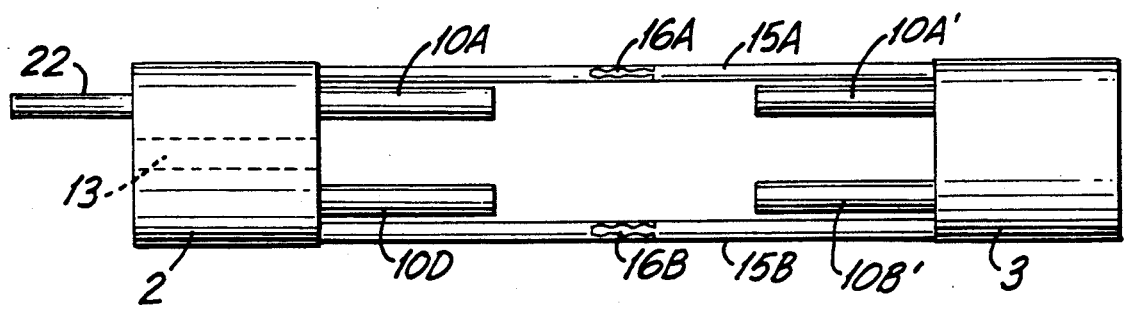
FIG. 6A is a side view and FIGS. 6B and 6C are front views of a third embodiment.
Figure 6B:
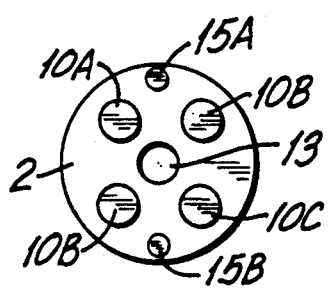
Figure 6C:
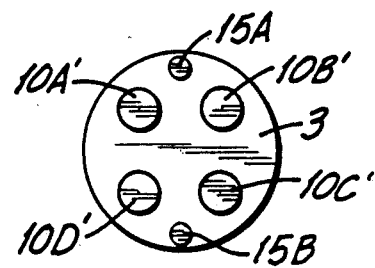

FIGS. 6A-6C show details of the preferred HHEX 2 and CHEX 3. Both heat exchangers have a number of bosses (round cylindrical protrusions) 10 that slide within with the respective bores 21A-21D in the WSM 1. The HHEX 2 has a hollow 13 through which the shaft 14 moving the WSM 1 is allowed to move without substantial friction. The two heat exchangers 2 and 3 are connected through two thermally insulating rods 15A and 15B.

The power to operate the heat pump of the instant invention can be supplied from one motor or two independent motors. For instance, the driving shaft 14 (FIG. 5) of the WSM 1 and the driving shaft 22 (FIG. 6) of the heat exchangers 2 and 3 are preferably connected via respective ball joints to the rotor of a motor (or to other rotating elements that may include reduction gears) using an eccentric drive pin on a plate rotated by the motor. Alternatively the shafts 14 and 22 are driven in such a manner as to force the movements of the WSM 1 and the pair of heat exchangers 2 and 3 along the chosen thermodynamic paths.

The simple construction of the Carnot reciprocating device allows for ease of miniaturization. A limit to such miniaturization is set by the mechanical properties of the materials used and their ability to bear the loads generated when working against the magnetic field gradients.

The specific cylindrical geometry shown in FIGS. 4, 5 and 6 (i.e. the tube 4) can be replaced with other types of geometry that will allow the respective movements of the heat exchangers and the WSM in the specific Carnot cycle desired. It should be clear, that to achieve the heat transfer between the WSM and the respective heat exchangers, many other types of mating geometries are feasible and such other mating geometries are included within the instant invention.

$H_2$ and $H_1$ can be provided as the residual field of the solenoid 5 (FIG. 4). It should be understood, however that other means of applying a gradual magnetic field change on the WSM 1 may alternatively be employed. The advantage of the specific device depicted in FIG. 4, is that only one magnetic field source need be utilized.

If the solenoid is a superconducting solenoid, once powered with a persistent current it may provide the required magnetic field for example (1-15 Tesla) without substantial additional use of electrical power.

When attempting to optimize the efficiency of a device based on the instant invention, the designer may use a specially designed magnetic field distribution which is not the field of a simple solenoid. In the schematic description of FIG. 4, the field distribution through which the working medium is moved is shown as being that of a solenoid, for simplification and practicality. One may, however choose more appropriate magnetic field distributions to better match the optimum field at each point in the cycle. This can be achieved by additional solenoids, fixed magnets, or using graded solenoids.

The low magnetic field part in the cycle, i.e. $H=0$ FIG. 4, need not necessarily be zero, and thus the use of the screening superconductor is not absolutely necessary. Furthermore, it is not absolutely necessary that the low magnetic field be under $H_{c1}$ at any part of the cycle, nor that the high magnetic field, $H_3$, be above $H_{c2}$ for any temperature of the WSM during the application of the field. The device of the instant invention can operate without actually reaching the fully normal or the fully diamagnetic phases respectively of the superconductor of the working medium. All that is required is that the WSM be cycled between states with different degree of diamagnetism. Such cycles are depicted in FIGS. 7A-7B.

Figure 7A:
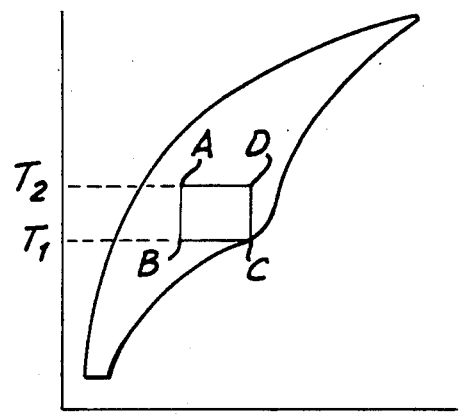
FIGS. 7A-7D are additional T vs. S graphs.
Figure 7B:
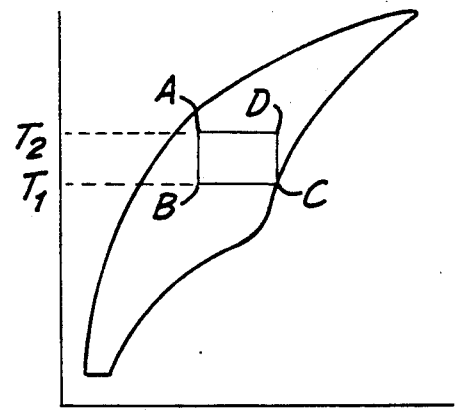

FIG. 7A shows the cycle of a magnetic heat pump of the instant invention where A, the high temperature low field point of the cycle is within the crescent and where the entropy of the superconductor is field dependent. FIG. 7B shows a similar cycle, except that the superconducting working media is forced (at point C, the low temperature, high field point of the cycle) to the normal phase, while A is kept as in FIG. 7A. The choice of a particular cycle depends on the properties of the particular superconductor used, its critical fields as function of the temperature and the ease of obtaining a zero field environment, $H_{c1}$ can be very low for high temperature superconductors and in smaller devices, it is sometimes difficult, due to proximity of the various elements to completely screen the applied magnetic fields, particularly when persistent current solenoids are used.

Figure 7C:
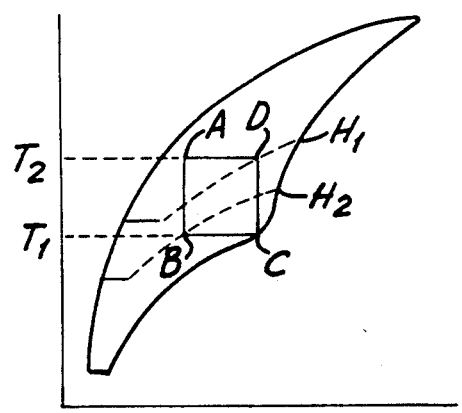
Figure 7D:
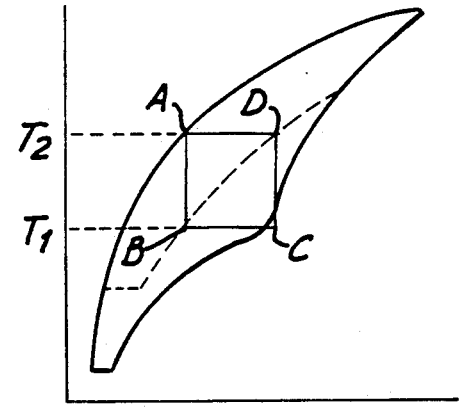
Figure 8A:
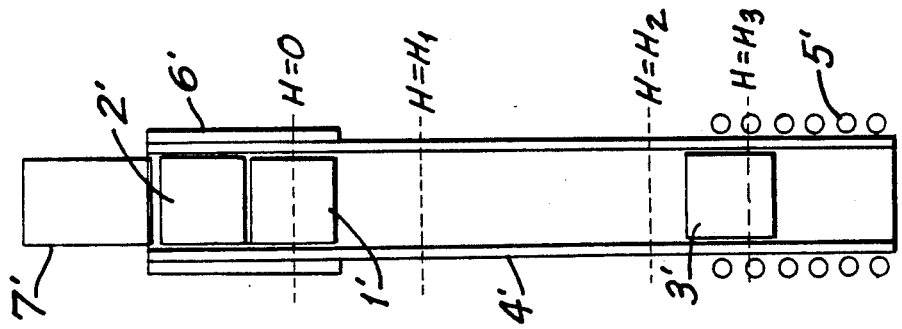
FIGS. 8A-8D are side cross-sectional views of a fourth embodiment.
Figure 8B:
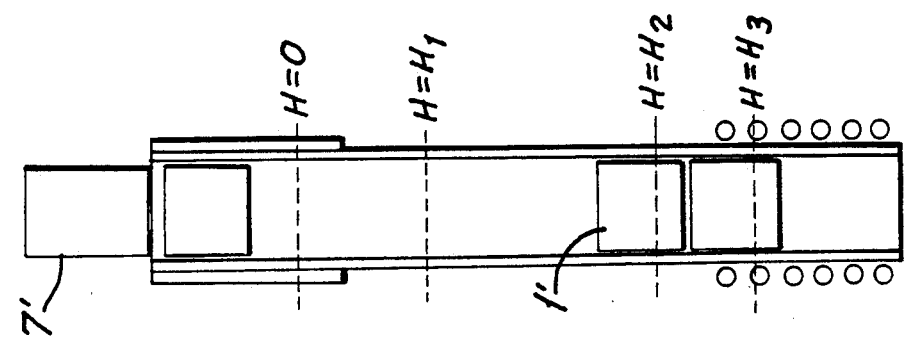
Figure 8C:
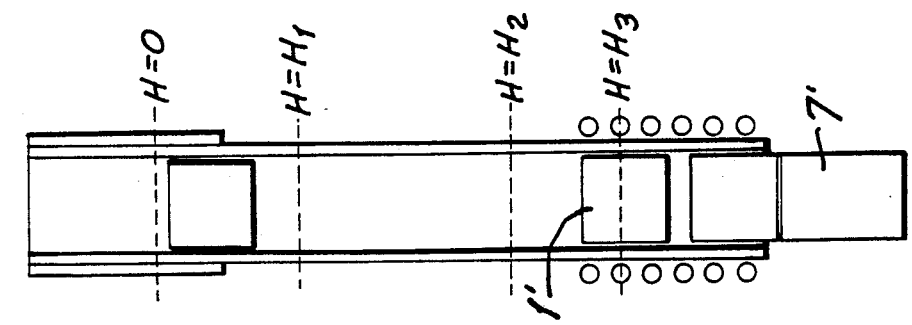
Figure 8D:
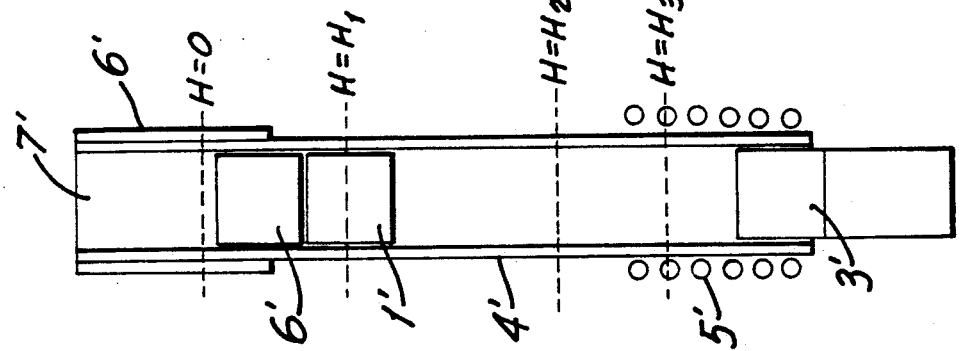

In FIGS. 7C and 7D there are shown two additional Carnot cycles having unique properties. In FIG. 7C, the two intermediate fields $H_1$ and $H_2$, the fields applied at points D and B respectively, are also obeying the condition within the superconductor $B_1 = B_2$. Since the magnetic flux, B, through the superconductor determines the density of fluxons penetrating the superconductor, and this density, in turns, determines the concentration of paired carriers, the cooling (or change in internal free energy) associated with adiabatic magnetic quenching will approximate the warming associated with the adiabatic demagnetization. In cycles where the flux density in the superconductors varies largely between point B and D, the system either overshoots or undershoots the desired end temperatures, resulting in a loss of efficiency. For many applications, obtaining the maximum (Carnot) efficiency is not always as important as simplification of design.

In FIG. 7D, such design simplification is achieved by choosing points B and D to have the same applied magnetic field rather than the same magnetic induction. We have not shown the details of the expected deviation from a pure Carnot cycle for simplicity.

In many applications it is desired that the heat exchangers be stationary rather than moving as described in FIG. 4.

This can be achieved in a number of ways. With the basic double reciprocating device described in FIG. 4, we may anchor the heat exchangers to the main tubular vessel (4 in FIG. 4), and cause the solenoid and screens to move in tandem. This embodiment is better described in FIG. 8

FIG. 8 shows a Carnot reciprocal heat pump in which the two heat exchangers are stationary, but the magnetic field configuration moves. The working superconducting medium (WSM)1', is first in contact with the stationary hot heat exchanger HHEX2' and is then within a superconducting screen 6', resulting in a magnetic field $H=0$ within the screen (FIG. 8A). This state is the same point A in FIG. 3A described above. The WSM1' is made to rapidly and adiabatically move just outside the superconducting solenoid 5', where the magnetic field $H=H_2$, at which point the WSM1' comes into thermal contact with the stationary cold heat exchanger CHEX3' (FIG. 8B). This state is point B in FIG. 3A, and between A and B adiabatic magnetization cooling of the WSM1' has occurred. The solenoid 5' and superconducting screen 6' are rigidly attached to each other within the thermally insulating tubular structure 4', which can slide over the main vessel 7' to which the two heat exchangers are fastened. The tubular structure 4' is now moved so that the solenoid 5' engulfs the WSM1', and thus applies a magnetic field $H=H_3$ to the WSM1', while the latter is still in contact with CHEX3' (FIG. 8C). This is the point C in the T,S diagram depicted in FIG. 3A. Now the WSM1' is rapidly moved to its initial position, except that due to the movement back of the screen, in tandem with the solenoid in the previous step, the field at this location is now $H=H_1$ and not zero (FIG. 8D). During this adiabatic reduction of the field on the WSM1', the WSM warms up due to adiabatic demagnetization of the superconductor and this is point D in the T,S diagram of the cycle described in FIG. 3A. At this point, the WSM1' comes back into contact with the HHEX2', and the tubular structure 4' is moved back to its original position while the WSM1' is in contact with the HHEX2' thus returning to the point A in the T,S diagram (FIG. 3A).

From a thermodynamic point of view, in the path AB, adiabatic cooling form $T_2$ to $T_1$ occurs due to adiabatic magnetization. In the path BC isothermal intake of heat from the CHEX3' occurs due to further decoupling of charge carriers in the maximum field $H_3$. In the path CD adiabatic warming of the WSM1' occurs due to the phase transition back to the superconducting state (mixed), and release to the lattice of the pair's binding energy. And in the completing leg of the cycle, DA, isothermal rejection of heat to the HHEX2' occurs, due to further coupling of charge carriers of the field is reduced to zero, and the WSM1' returns to its fully superconducting state.

The device of FIG. 8 has two advantages relative to the device described in FIGS. 4 to 6. First, the heat exchangers are stationary, which simplifies the design of the system and its application. Secondly, the two reciprocal movements are completely independent from each other, namely at any point in time, either the WSM1' or the tubular structure 4' (the magnetic field) are in movement, thus obviating the need for exact synchronization of the two movements, and allowing in principle the use of a single driving mechanism to obtain both movements. Furthermore, by the appropriate design of the magnetic field, one can obtain a device in which the two displacements (WSM and field configuration) are equal, thus further simplifying the design. The enhancement of heat exchange between the WSM and the two heat exchangers can be achieved in a manner similar to that described in FIGS. 5 and 6, or by other arrangements. A further advantage of both double reciprocating Carnot heat pumps of the instant invention is that they are easily amenable to miniaturization.

FIG. 9A to 9D shows another embodiment of a Carnot magnetic heat pump of the instant invention, whose structure is appreciably different than the two double reciprocating devices described above. The heat pump of FIGS. 9A-9D is a rotary Carnot heat pump. The device consists of a disk 1a on which three appropriate magnetic field sources are positioned; a working superconducting magnetic medium, WSM 2a; a hot heat exchanger, HHEX 3a, a cold heat exchanger CHEX 4a; and a pair of thermal switches 8a that connect the WSM2a to the heat exchangers thermally. These "thermal switches" may be implemented by the movement of a liquid (or gas) moving between the heat exchangers and the WSM, or alternatively the bringing of each heat exchanger in thermal contact with the WSM. The specific switch used is not intended to limit the scope of the present invention.

Figure 9A:
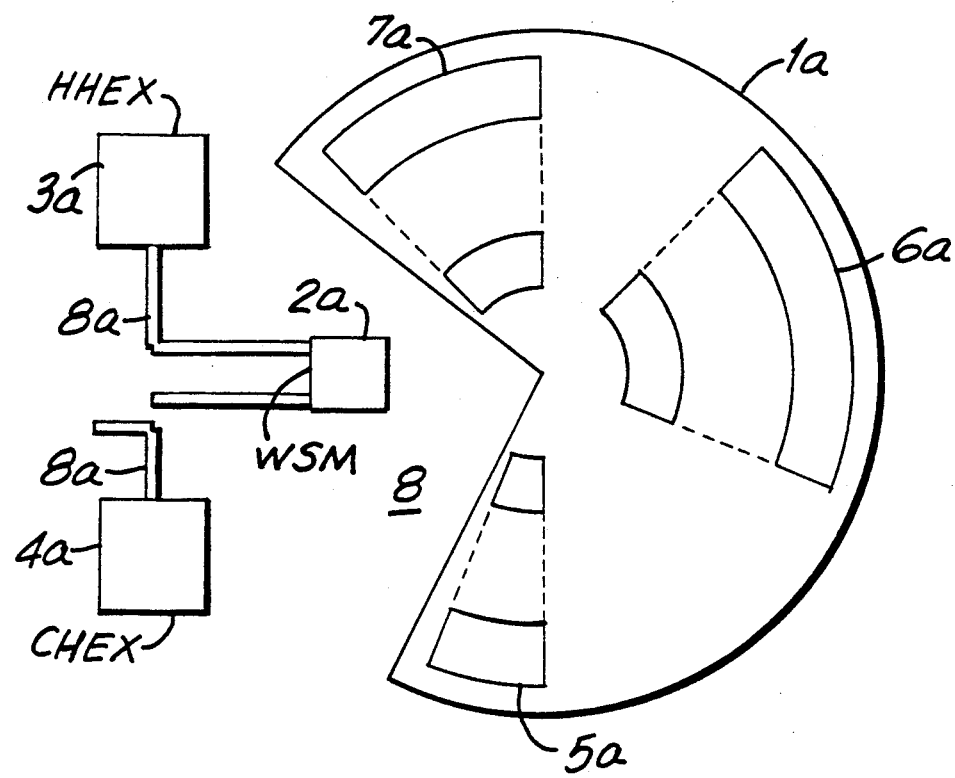
FIGS. 9A-9D are sequentially the points A to D on the T,S diagram of FIG. 3A.
Figure 9B:
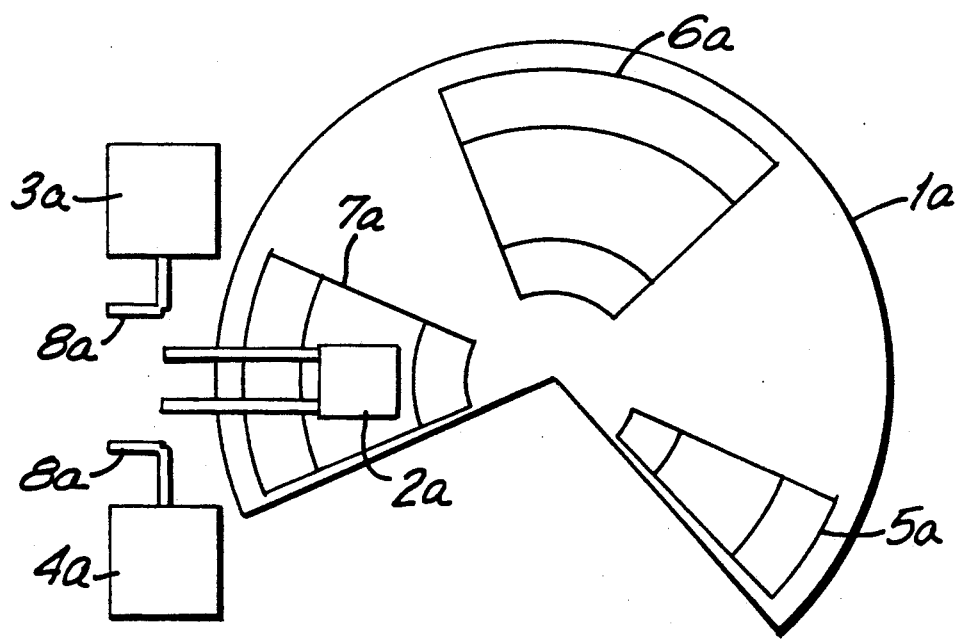
Figure 9C:
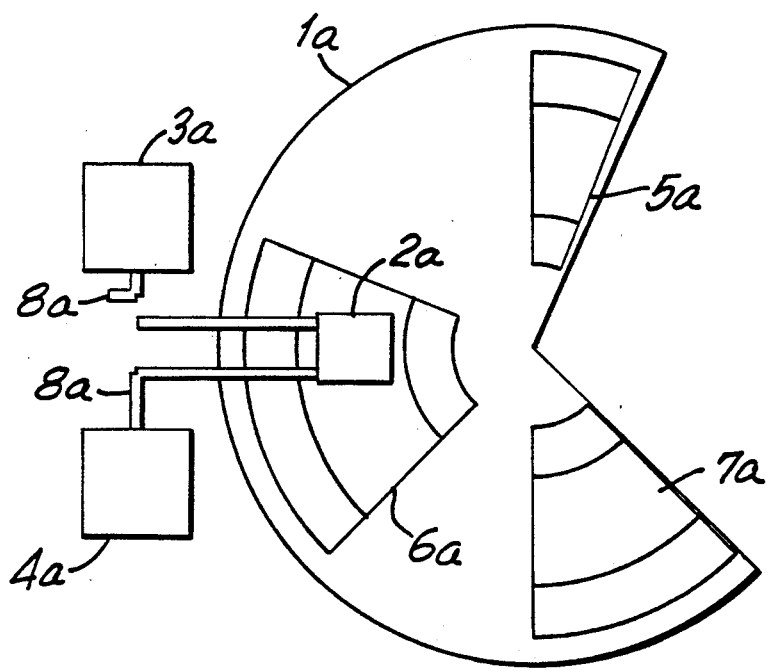
Figure 9D:
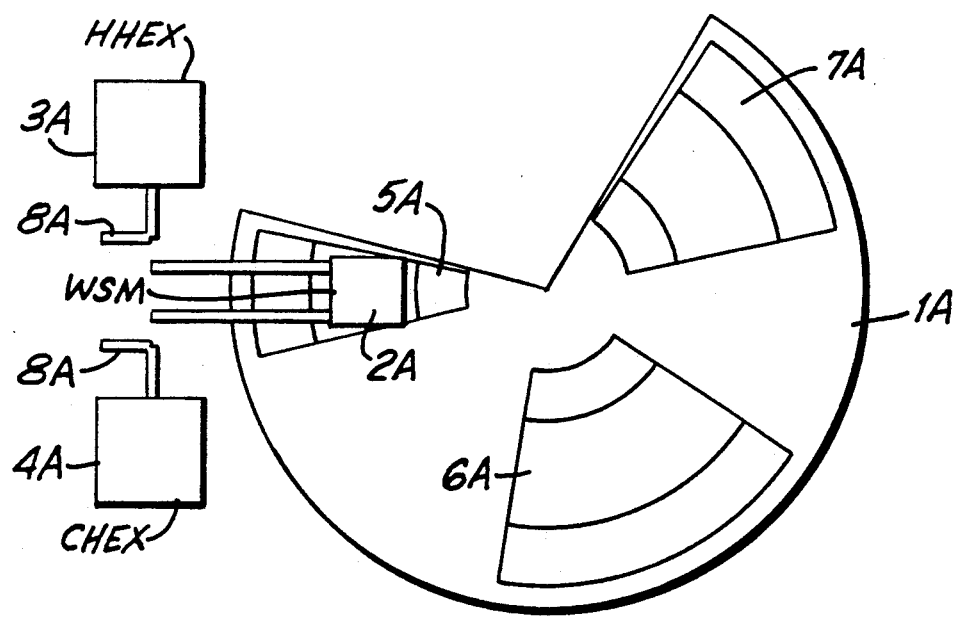

The respective magnetic field sources 5a, 6a and 7a create spaces having respectively field intensities $H_1$, $H_3$ and $H_2$, obeying the relationship $H_1 < H_2 < H_3$. In FIGS. 9A-9D, the physical size of the different field sources is shown as being different, but it is quite possible to create such fields with the required magnetic intensities which vary from each other and yet all have the same physical dimensions. The operation of the rotary Carnot magnetic heat pump is essentially as described earlier for the two double reciprocating heat pumps, except that in this case, the WSM is stationary and the magnetic fields are brought to the WSM in a rotating manner. The disk 1a rotates counterclockwise so as to impose on the WSM2a magnetic fields in the following sequence, $H = O$, $H = H_2$, $H = H_3$, $H = H_1$ and back to $H = 0$. FIGS. 9A to 9D represent sequentially the points A to D on the T,S diagram of FIG. 3A. In FIG. 9A, the WSM2a is in a zero magnetic field and in thermal contact via a thermal switch 8a with the HHEX3a. When the disk is rotated counter clockwise, and the thermal switch disconnected, a magnetic field $H_2$ is applied adiabatically to the WSM2a, as shown in FIG. 9B, thus causing cooling of the WSM2a. The disk then continues to rotate, and the WSM2a is thermally connected with the CHEX4a, until the magnetic field on the WSM2a is $H_3$, as shown in FIG. 9C. Heat flows isothermally form the CHEX4a to WSM2a during this step of the cycle. As the disk 1a rotates further, the thermal contact to the WSM2a is disconnected and a smaller field $H_1$ is applied on the WSM2a, as shown in FIG. 9D, while the thermal switch with the HHEX3a is activated, thus rejecting heat to the HHEX3a.

While in principle, the magnetic fields for the embodiment of a rotary Carnot heat pump of the instant invention can be provided by appropriate solenoids, the completely enclosed space provided by a solenoid poses some difficulty with the connection and disconnection of the heat exchangers to the WSM. One can, design a heat pump as described in FIG. 9 with solenoids and achieve the connecting and breaking of the switches from the open ends of the solenoids, after they have entered the respective solenoids. Such an implementation would somehow degrade the efficiency of the heat pump, since it would only approximate a Carnot device, due to the entry and exit of the WSM into each of the magnetic fields. During the adiabatic steps, only the end fields are important, but during the isothermal steps, the field should increase or decrease continuously as the WSM's entropy increases or decreases.

Figure 10:
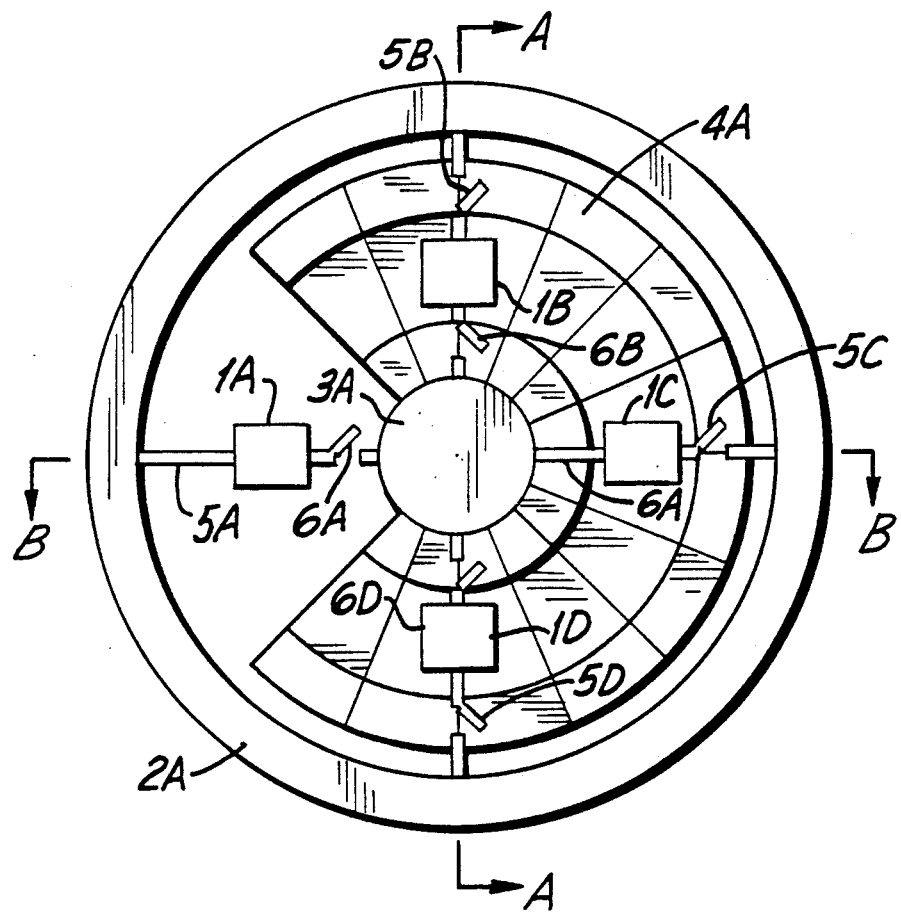
FIG. 10 is a top view of a rotary carnot heat pump.

A device which is closer to the theoretical rotary Carnot device can, however, be designed with the principles of the instant invention when the magnetic fields are provided by a series of small gap magnets (or electromagnets) as described schematically in FIG. 10.

FIG. 10 shows a rotary Carnot heat pump of the instant invention having a multiplicity of fixed working superconducting media, WSM, 1A to 1D. A peripheral fixed hot heat exchanger, HHEX 2A is thermally connected and disconnected to the respective WSM with a multiplicity of thermal switches 5A to 5D. A centrally located cold heat exchanger 3A is thermally connected and disconnected to the respective WSMs with another set of thermal switches 6A-6D. A series of small magnets (4A), of the gap type, are located on a rotating disk and occupy about ¾ of the disk's space. The magnetic field sources have the general yoke form described in FIG. 11, having a magnetic field gap 50 between poles 51 and 52 within which the WSM are positioned. This magnetic field configuration allows for easy connection and disconnection of the WSMs with the CHEX and HHEX via the thermal switches 5A to 5D and 6A to 6D.

FIG. 12 A and 12B are cross sections (see FIG. 10) of a preferred embodiment. The WSM's (1A to 1D), are mounted on a support ring 7A, made of a thermally insulating substance, and positioned so that the WSMs are within the gaps of the magnetic field sources 4A. The disk supporting the magnetic field sources is not shown. In FIGS. 12A and 12B, the thermal switches 5A to 5D and 6A to 6D are anchored on the WSMs and capable of making a sliding contact with the HHEX 2A (5A to 5D) or the CHEX 3A (6A to 6D).

The field strengths to which the WSMs are exposed can now be adjusted by chosing in each magnetic source element the appropriate field strength. As the disk rotates, each WSM is exposed to four main field intensities as described in the device in FIG. 9, except that no field extinction occurs between the steps. Specifically, the field strength in the region occupied by the WSM 1A, is nil, or close to nil, the field strength in the space occupied by WSM 1B is $H_2$. The field strength increases continuously to $H_3$, where the WSM 1C is positioned and is reduced to $H_1$, where the WSM 1D is positioned. Between WSM 1D and WSM 1A, the field should decrease continuously to nil. The areas where discontinuous field are not detrimental to the heat pump's efficiency are between $H = O$ and $H = H_1$, and between $H = H_3$ and $H = H_2$, (but continuous field changes between these regions do not adversely affect the operation of the heat pump).

In operation, the magnetic field disk is caused to rotate counterclockwise so that each WSM is exposed to the appropriate fields sequentially and connected and disconnected to the two heat exchangers, as in FIG. 10.

A multiplicity of WSM may be mounted on a ring (7A in FIG. 12A) and rotated within the fixed magnetic configuration. With that embodiment, the two heat exchangers may be in synchronous rotation with the WSM to facilitate connection and disconnection with the heat exchangers. Alternatively the heat exchangers may be stationary and sliding thermal contacts used to connect and disconnect the heat exchangers with the WSMs.

If the WSMs are rotating and the heat exchangers and magnetic fields are stationary, the sliding thermal contacts may be anchored to the heat exchangers and make sliding contact with the appropriate WSM when it rotates to the correct location. A single thermal switch for each WSM may be anchored to the respective WSM and make alternate contacts to the HHEX and CHEX as appropriate in the desired thermodynamic cycle, by having such switch centrally anchored on each WSM and rotating the closing part of the switch in a 180° pattern between three states a. Contact with the HHEX, b. no contact with a heat exchanger and c. contact with the CHEX. Another variation involves the simultaneous countermovement of both the magnetic field sources disk and the WSMs' rings.

Figure 11:
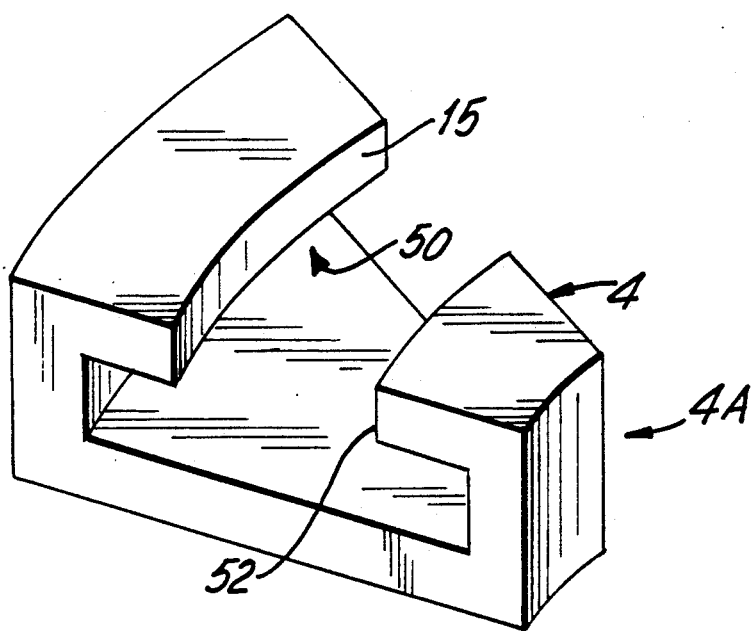
FIG. 11 is a perspective view of a magnet structure.

The magnet segments illustrated in FIG. 11 may take a number of different forms. These segments can be permanent magnets, for instance made of NdFeB compounds and capable of providing field strengths up to 1.2 Tesla in a 1 cm gap. Alternatively the segments may be electromagnets, each powered by a coil in its respective base, and the shape shown in FIG. 11 made of a high susceptibility ferromagnetic material, like soft iron. The coil may be made of normal or superconducting conductors, and maximum fields close to 2 Tesla may be achieved before saturation in the yoke occurs.

One can also use a superconducting solenoid coiled around a hollow shape as described in FIG. 11, operating in the persistent mode, and thus obtain an "air yoke" electromagnet, with minimal joule heating losses and achieve maximum fields of up to 5 Tesla, and possibly more.

The advantage of the design shown in FIG. 10 relative to the one described in FIG. 9, is the fact that cycles closer to the Carnot cycle can be used. The disadvantage is that in FIG. 9 solenoids (superconducting) can be used, thus allowing maximum field strengths up to 7-8 Tesla, while in the device described in FIG. 10, solenoids cannot be used since they would complicate access to the thermal switches.

One way to circumvent this shortcoming is by using the device described in FIG. 10 with the WSMs rotating and the magnetic field and heat exchangers stationary. The magnetic fields would then be created within a segment of a toroid with variable cross section, or variable winding density. In this case, the piping for connecting the heat exchangers to the WSM may be achieved by distorting the coils of the toroid, to allow penetrating the toroidal structure, and the thermal switches (of the sliding contact type) enclosed within the toroid segment. It is best in this case to use no more than 75% of the toroid circumference, to assure a magnetic circuit with zero, or near zero field at point A of the cycle. One may find that the edge field of the toroid is sufficient for point D of the cycle, thus simplifying somewhat the design, by allowing entry of the heat exchangers' piping from the open ends of the toroid rather than distorting the coils and thus the field within the solenoid.

D. A Pseudo-Brayton Magnetic Cycle

Figure 13:
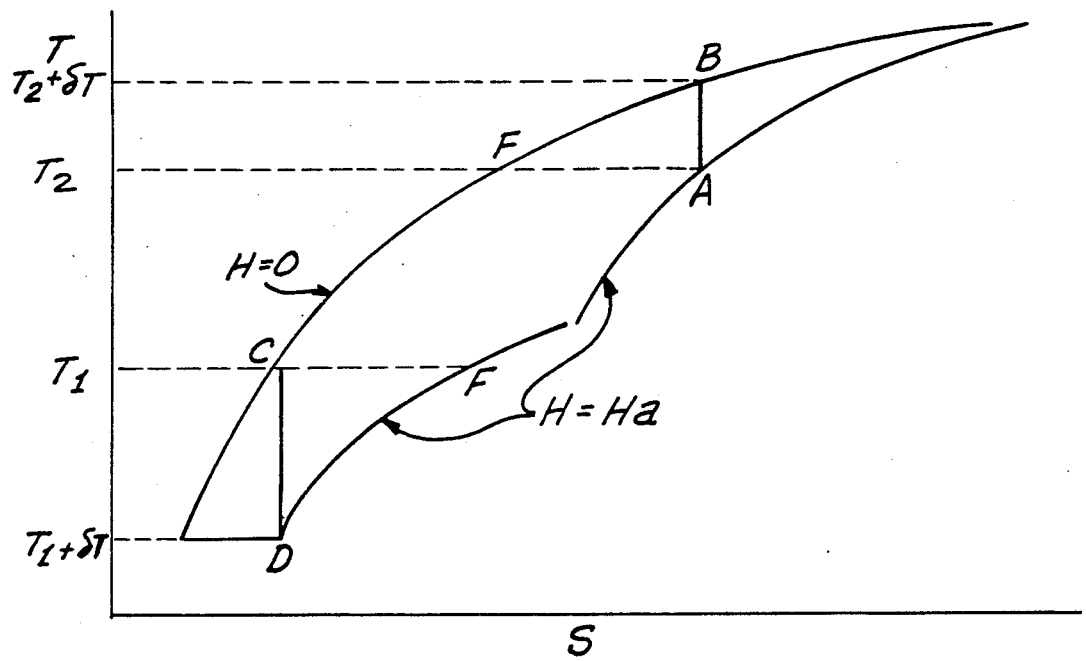
FIG. 13 is a T vs. S graph.

FIG. 13 shows the T,S diagram traced by a working high temperature superconductor operated in a pseudo Brayton magnetic cycle. The refrigerator operates between two isentropic lines (AB and CD) and two isofield lines (DFA and BEC). From a thermodynamic point of view, the Brayton cycle of the instant invention differs drastically from the traditional Brayton cycle operating on the basis of the classical magnetocaloric effect, where the cycle is composed of two isentropic and two isomagnetic lines. In the instant invention, BEC is an isofield and isomagnetic line (H=B=O), but DFA is only an isofield line and in general, not an isomagnetic line. The magnetization of the superconductor of the instant invention, under an applied magnetic field $H_a$, is temperature dependent in the mixed state (for instance along the line DF) so the line DFA is not isomagnetic. Below there is described a special embodiment of the instant invention which is a true Brayton cycle heat pump, but the following embodiment is the general case or the pseudo-Brayton cycle based device.

The cycle described in FIG. 13 may be implemented in a machine where, for instance, the working superconductor medium (WSM) (the superconductor) is rotated in and out of a fixed persistent magnetic field. The efficiency of this cycle could be as high as 70% of Carnot efficiency, with a larger temperature lift for the same magnetic field differential. To achieve such a larger lift, regeneration or recuperation heat exchanging is applied.

Figure 14:
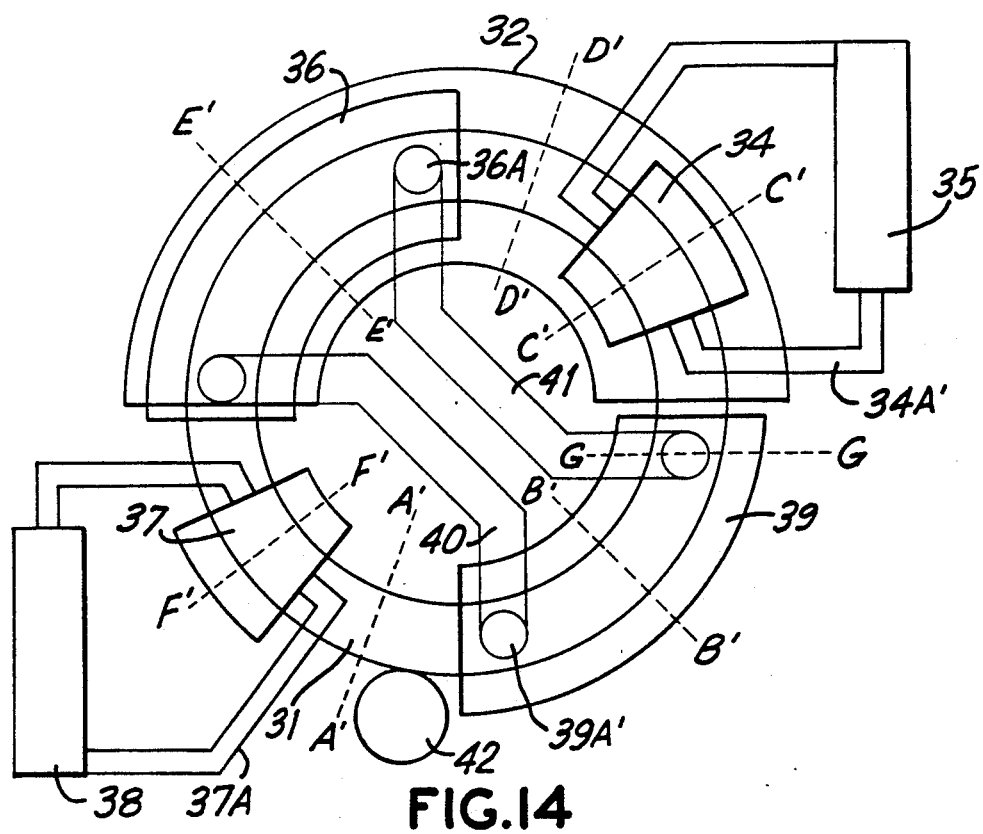
FIGS. 14 and 15 are top views of another embodiment.
Figure 15:
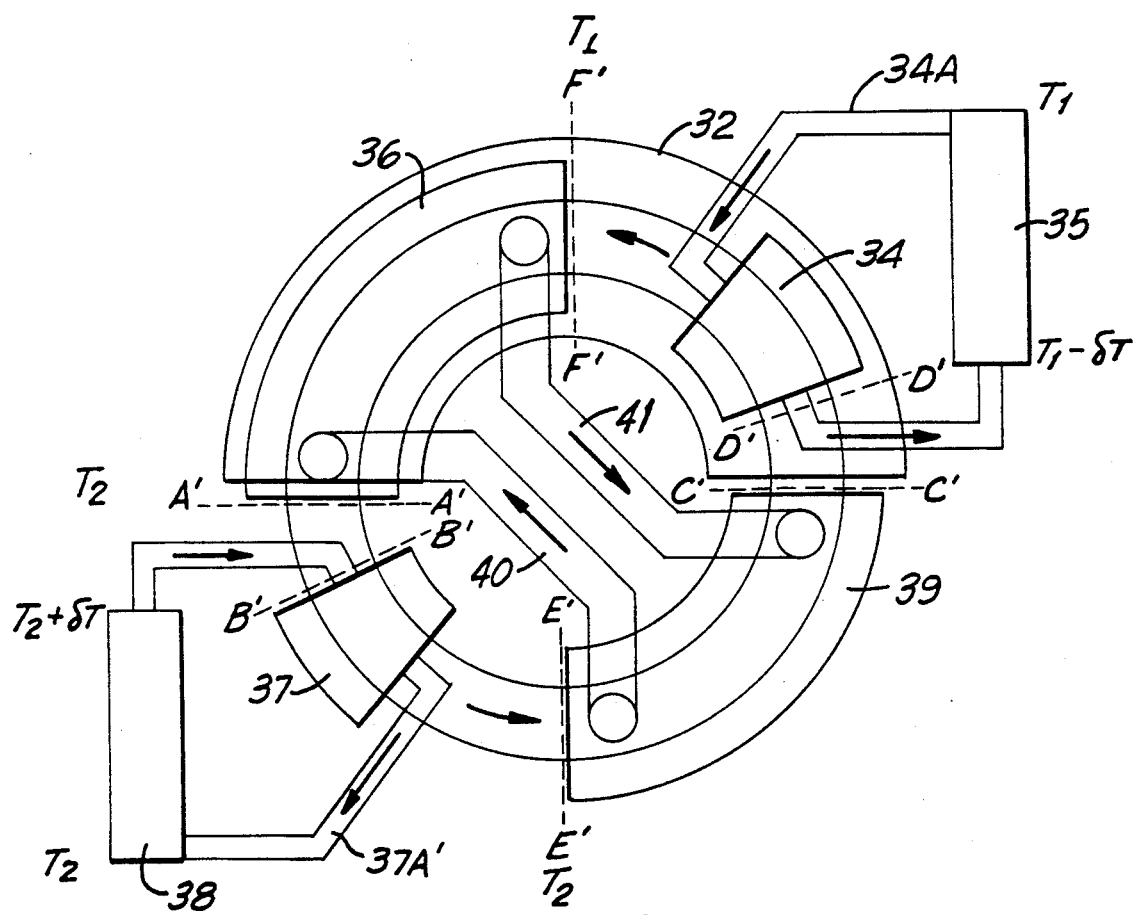

FIG. 14 schematically describes the major elements of such a rotary heat pump, having a general toroidal topology. In FIG. 15 the same device is shown with the thermodynamic reference points (A to F) marked as well as the temperatures achieved at each of these points. In FIG. 16 there is shown cross-sections of the device in various planes (marked A to G in FIG. 14) perpendicular to the axis of the main toroid.

The working superconductor medium (not shown explicitly in FIG. 13), consists of discrete elements 33 of a high temperature superconductor, for example a 1-2-3 ceramic, mounted radially on a ring 31. Their envelope forms a toroid-like shape with a cross section shown in FIG. 16A. The mounting ring 31, whose cross-section is shown in FIGS. 16A-16G, is preferably of a material which is thermally insulating within the operating temperature range of the device. The ring 31 is driven so that it rotates continuously around its center. The working superconductor medium enters and exits a magnetic field fixed at a given location. In FIG. 15 that rotary movement is counterclockwise. The magnetic field is generated in a coil 32 preferably made of a superconductor. It has the form of a segment of a toroid enclosing the toroid formed by the working medium superconductor elements 33 and operating in the persistent mode. The superconducting elements 33 when rotated, come into low friction thermal contact with first a hollow CHEX (cold heat exchanger) 34 within the magnetic field having fluid within it (liquid or gas). The fluid flows through the CHEX in a direction opposite the WSM movement direction. That fluid is pumped to the load 35 via a pipe 34A. The superconducting elements 33 are then rotated until they come into low friction thermal contact with a recuperative heat exchanger 36 within the magnetic field. Third, superconductor elements 33 make low-friction thermal contact with a hot heat exchanger (HHEX) 37 in a nil magnetic field, which HHEX 37 is connected to the heat rejection element 36. The fluid which is warmed is pumped through passageways 37A, in a direction opposite to the WSM movement, and through the heat rejection device, for example a coil in liquid nitrogen. The superconductor elements 33 then make thermal contact with a recuperative heat exchanger 39 which is also in a nil magnetic field. The heat exchanging fluid media all flow counter the movement direction of the working superconducting medium.

The vessel elements containing the recuperative heat exchanging medium are connected to each other by tube structures 40 and 41. This recuperative heat exchanger, which is in a closed loop, has two branches in thermal contact with the working superconducting medium. The field-less branch 39 and the in-field branch 36.

FIG. 14, shows a driving wheel 42, which by friction drive or gear drive, rotates the mounting ring 31 at a controlled speed. The space between the hot heat exchanger 37 and the field-less recuperative heat exchanger 39 as well as the space between the cold heat exchanger 34 and the in-field recuperative heat exchanger 36 is preferably minimized. However, the empty space between the in-field recuperative heat exchanger and the hot heat exchanger, as well as between the cold heat exchanger and the field-less recuperative heat exchanger must be maintained to allow for adiabatic warming and cooling of the superconducting medium respectively.

The mating structure of the superconducting elements and the heat exchangers' vessels, their low friction good thermal contact, is to facilitate heat transfer between the superconducting medium and the heat source, heat sink and the recuperative heat exchanger.

Operation of The Rotary Brayton Magnetic Heat Pump of FIGS. 13–15 is as follows. The effect described is on a selected one of the superconducting elements 33 mounted on the rotating ring 31. The points A, B, C, D, E and F are the same in FIGS. 13 and 15, except that in FIG. 13 the thermodynamic locations are given and in FIG. 15 the letters A'–F' refer to corresponding physical locations within the device. In FIGS. 13 and 15, between points A' and B' the field on each superconductor element 33 is reduced to almost zero as each element exits the curved solenoid (this is an adiabatic region of the cycle). The superconducting working medium is divided into discrete elements 33 and mounted on a thermally insulating ring 31 to assure the adiabatic nature of this step in the cycle. For example there may be 6–100 superconductor elements 33 (depending on size and geometry) connected to ring 31. At point A' the superconductor element 33 is already well within the normal phase and all charge carriers are decoupled. Due to the extinction of the applied magnetic field, the superconducting phase is reestablished and pairing energy released to the lattice, thus adiabatic warming to a point $T_2$+Delta T occurs at point B' in the cycle. In the region between point B' and E' of the cycle, heat is rejected to the high temperature heat exchanger (HHEX) 37, and the superconductor cools back to $T_2$. The HHEX is a hollow element through which a heat transfer fluid is moving in counter flow to the WSM. As the superconductor continues to move counter clockwise, it meets a hollow heat exchanger 39 at point E', in which a heat transfer fluid is moving clock wise in its own closed containment (Tubes 40, 41) but in close thermal contact with the WSM and discharges heat to this medium until point C' is reached. At point C' the temperature of the superconductor element has now cooled to $T_1$. At this point the superconductor enters the magnetic field and is quenched adiabatically to the mixed state and as a result of the decoupling of the charge carrier pairs, the superconductor cools to $T_1$-Delta T at point D'. Between point D' and point F' heat is taken from the cold load 35 via the hollow cold heat exchanger 34 so that the temperature of the WSM rises back to $T_1$ at point F'. Between point F' and point A' (the beginning of the cycle) WSM is heated to $T_2$ by the clockwise recuperative flow of the heat transfer medium in exchanger 36 in tubes 40, 41.

The containment vessel for the recuperative flow, consists of four main elements namely the in-field exchanger 36, the field-less exchanger 39 which are connected by the tubes 40, 41 and has a constant temperature profile (but the gas or the liquid heat transfer medium in this vessel flows clock wise). At the points F' and C' its temperature is $T_1$ while points E' and A' its temperature is $T_2$. In the leg C'E' of its flow its temperature rises from $T_1$ to $T_2$ while cooling the WSM from $T_2$ to $T_1$ (the path EC for WSM). In the leg A'F' of its flow its temperature declines form $T_2$ to $T_1$ while warming the WSM from $T_1$ to $T_2$ (the path FA for WSM). An appropriate variable speed pump which pumps the fluid in tubes 40, 41 (not shown) assures that this temperature profile stays constant during the heat pump's operation. The magnetic field applied and the temperatures $T_2$ and $T_1$ are preferably selected so that the heat transferred to the superconducting elements in the path A'F' from the recuperative heat exchanging medium is equal to heat transferred to the recuperative heat exchanging medium in the path C'E' from the WSM. This can be better seen from examining FIG. 17 where the heats transferred to and from the recuperative heat exchangers are shown. The horizontally hatched area enclosed by the points 1, 2, 3 and 4, is the heat transferred to the heat exchanging medium while the WSM is cooled from $T_2$ to $T_1$, while the vertically hatched area enclosed by the points 5, 6, 7, and 8, represents the heat transferred to the WSM while warming it up from $T_1$ to $T_2$. For these relationships, which are preferred, to be obtained, the segment 58 must be larger then the segment 14. In thermodynamic terms, the entropy difference between F' and A' must be larger than the entropy difference between E' and C' on FIG. 13.

Figure 17:
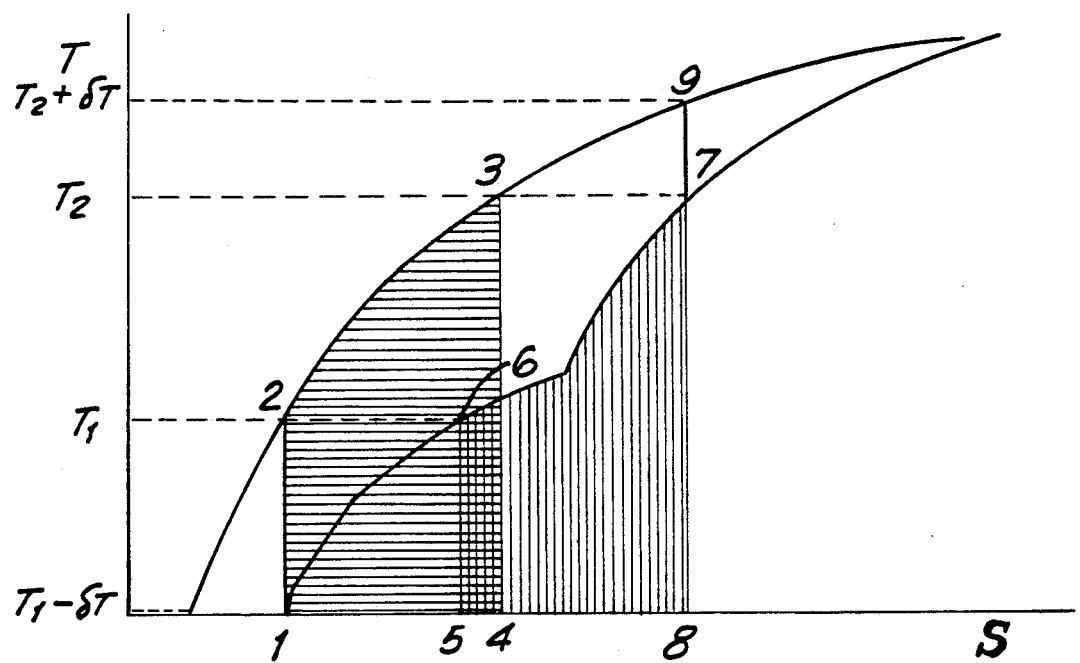
FIG. 17 is a T vs. S graph of the Brayton cycle device.

The preceding description is under ideal situations, in practice, the heat transferred to WSM in segment FA will always need to be slightly larger than the heat transferred to the recuperative heat exchanger, since it is not possible to completely isolate thermally the heat exchanger from other parts of the device. FIG. 17 shows the important heat transfer and work required to operate the device. The work is the area enclosed by the cycle, namely the area enclosed by the points 1, 2, 3, 9, 7, 6, 1. The heat extracted from the cold load is the area enclosed by the points 1, 2, 6, 5, 1, and the heat rejected to the hot heat exchanger is the area enclosed by the points 4, 3, 9, 8, 4.

As we have mentioned above, the thermodynamic cycle described in FIG. 13, is not a pure Brayton cycle since the application of the high magnetic field results in a region of the cycle where the magnetic induction within the working superconducting medium (WSM) is field dependent in the mixed state.

The device described herein would operate satisfactorily, if $T_1$-Delta T was chosen so that the applied field $H_1 = H_{c2}(T_1\text{-Delta T})$, or that the WSM is quenched all the way to the normal phase at the lowest temperature of the cycle. Under these circumstances, isofield paths (applied magnetic fields) would be isomagnetic paths (magnetic induction) since at the low field H=B=0, and at the high field the normal phase's magnetic susceptibility is field independent.

Yet another embodiment of a Brayton-like heat pump is described in FIGS. 18 and 19. This device, termed a "double reciprocating orthogonal heat pump" consists of five main elements, Referring to FIG. 18A, a working superconducting medium, WSM 1b capable of being moved back and forth between a stationary cold heat exchanger, CHEX 2b and a stationary hot heat exchanger, HHEX 3b. A magnetic field source 4b moves in a direction orthogonal to the WSM movement and in tandem with a recuperative heat exchanger system. The heat exchanger consists of four main elements, an infield heat exchanger 5b, a low field heat exchanger 6b, and heat exchanger medium return piping 7b and 8b. The recuperative heat exchanger is a counter flow device in which the heat exchanging medium is flowing clockwise.

Figure 19A:
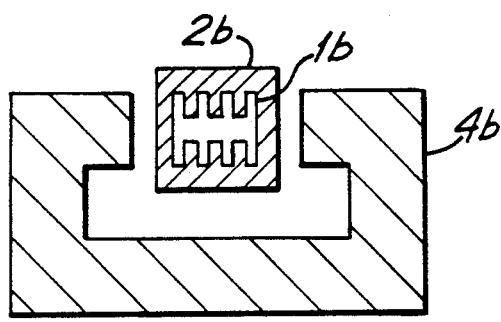
FIGS. 19A-19D are cross-sectional views of another embodiment.
Figure 19C:
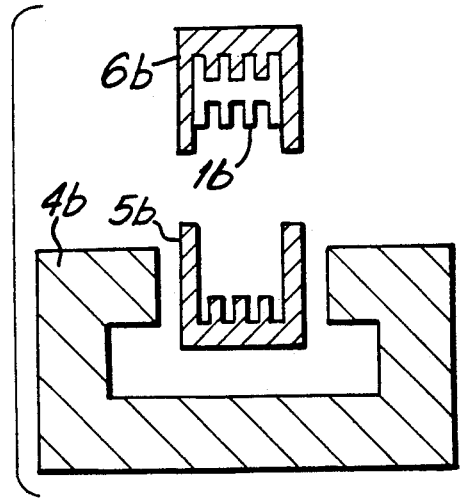
Figure 19B:
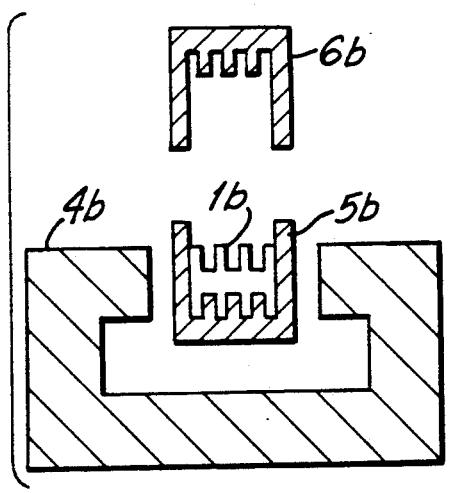

FIGS. 19a to 19C are cross-sections through the respective planes A, B and C shown in FIGS. 18A, 18B and 18E. The WSM 1b has a shape that mates within the heat exchangers 2b and 3b as shown in FIG. 19A for the CHEX 2b. The recuperative heat exchangers 5b and 6b are hollow structures within which the recuperative heat exchanging fluid is caused to flow by a variable speed pump (not shown) in a direction opposite the WSM movement. The hollow structures' cross section are shown in FIGS. 19B and 19C. These heat exchangers are made of thermally conductive materials, for instance copper, and their outer surface contacts the WSM for good heat transfer. The magnetic field structure 4b may be obtained by a permanent magnet (about 1 Tesla when using a NdFeB based magnet), an electromagnet with a soft iron yoke (with a field of about 2 Tesla), for example with a superconducting coil at the base of the yoke, or toroid coil of superconducting wire around the structure creating an air yoke magnet with a field strength in excess of 5 Tesla.

The operation of the device is best understood in conjunction with the thermodynamic cycle described in FIG. 13 and FIGS. 18A to 18F. Specifically, in FIG. 18A, which corresponds to point D in FIG. 13, the WSM 1b is at a temperature $T_1$-Delta T, and is being warmed to the temperature $T_1$, while in contact with the CHEX 2b in the applied high magnetic field. The WSM 1b is now moved to come in contact with the in-field recuperative heat exchanger 5b (FIG. 18B), which corresponds to point F in FIG. 13, and as WSM 1b moves from the left side of the recuperative heat exchanger to its right side, WSM 1b meets progressively higher temperatures and is thus being warmed up to $T_2$, when reaching the rightmost side of the recuperative heat exchanger 5b as in FIG. 18C (point A in FIG. 13). Now, the magnetic field, with the recuperative heat exchangers assembly are moved down, (or in a direction orthogonal to the WSM movement) while the WSM 1b is moved out of contact with the recuperative heat exchanger 5b, and as a result adiabatic demagnetization of the WSM 1b causes its temperature to rise to $T_2$+Delta T, when the WSM is brought into contact with the HHEX 3b, outside of the magnetic field, as in FIG. 18D (point B in FIG. 13).

The hot heat exchanger is at $T_2$, and thus absorbs heat from the WSM 1b until the latter cools to $T_2$. The WSM 1b is now moved back to the left, in a reciprocating motion, except, that it now comes in contact with the low field recuperative heat exchanger 6b, as in FIG. 18E (point E in FIG. 13), and as it moves to the left, the WSM 1b is being cooled by the recuperative heat exchanger 6b, until it reaches the leftmost part of 6b and reaches the temperature $T_1$, as in FIG. 18F (point C in FIG. 13). Now the magnetic field structure and the recuperative heat exchanger are moved back up to their original position while the WSM 1b is taken out of contact with the recuperative heat exchanger 6b. As a result, adiabatic magnetization cooling of the WSM 1b to $T_1$-Delta T occurs, and the WSM 1b is brought into contact with the CHEX 2b as in FIG. 18A (point D in FIG. 13). The CHEX 2b is at $T_1$, thus heat is transferred to the WSM 1b from the CHEX 2b until the WSM 1b warms back to $T_1$, and the cycle is repeated.

Figure 19D:
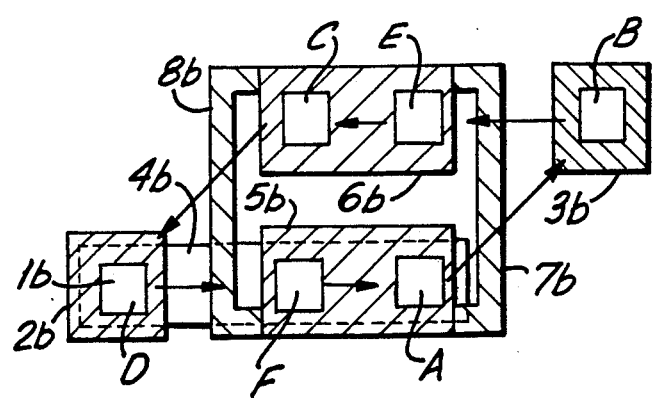

In a variant of this device the magnet structure with the recuperative heat exchanger, as well as the CHEX and HHEX are stationary, as shown in FIG. 19D. In FIG. 19D the WSM 1c moves along the sides of a parallelogram formed by the points DFABECD' which are also the thermodynamic points in the cycle described in FIG. 13, while the heat exchangers and magnetic field are stationary. By modifying the heat exchanger relative positions other geometries of movement are possible. In this arrangement, a multiplicity of WSM can be employed, each undergoing sequentially the cycle described herein. By transforming the parallelogram, shown in FIG. 19D, to a circle, the device essentially shown in FIG. 14 is obtained. Therefore, any geometry or arrangement of the respective elements of the heat pump of the instant invention which is a conformal transformation between the arrangement of FIG. 14 and FIG. 19D, and will expose the WSM to a thermodynamic cycle as described in FIG. 13, will result in a workable Brayton magnetic heat pump.

Ericcson magnetic heat pumps

Figure 2C:
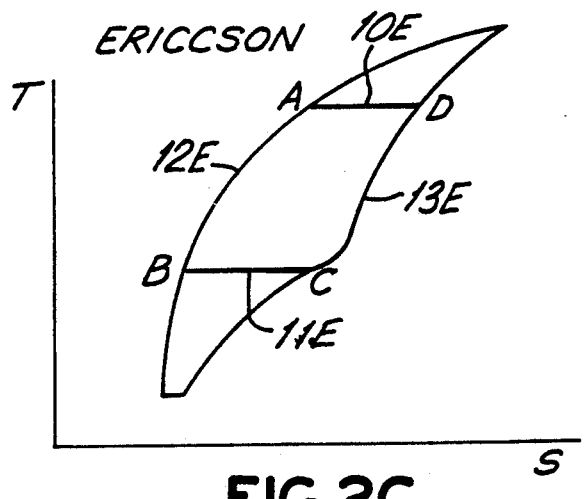

An Ericcson magnetic heat pump thermodynamic cycle is shown in FIG. 2C. The cycle consists of two isothermal paths (10E and 11E) and two isofield paths (12E and 13E). Embodiment of devices using the Ericcson cycle can take forms that are essentially the same as the Brayton heat pumps, except that the application and removal of the magnetic field are carried out isothermally. Furthermore, it is important to design the gradual increase and decrease of the magnetic field to match the rate of heat rejection to and from the WSM in the isothermal paths.

Figure 20:
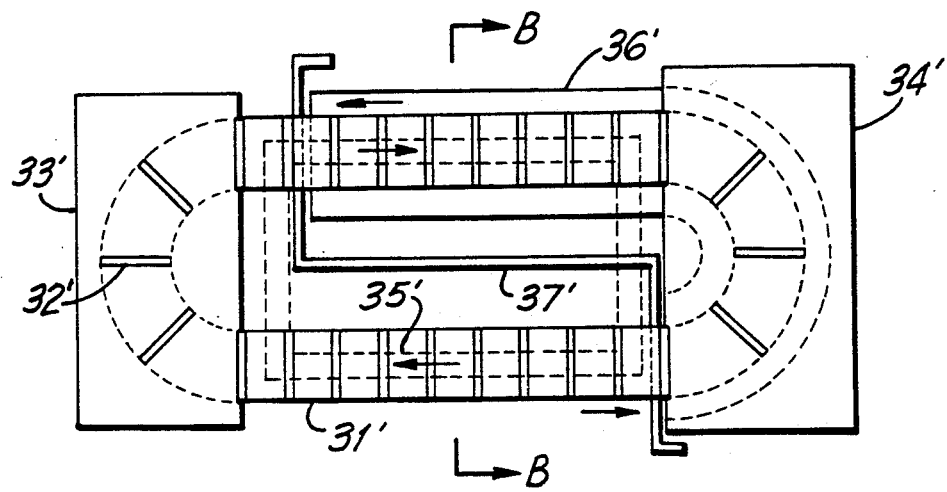
FIGS. 20 and 21A, 21B are top views of a race-track type device.

An embodiment of an Ericcson-type heat pump is shown in FIG. 20. A main structure 31', having the general structure of a race track (a rectangle terminated by semicircles) serves as a frame for holding a multiplicity of thermally conductive plates on each is mounted a superconducting element 32'. The plates are loosely connected so that they can freely move around the track, carrying with them the superconducting elements 32'. The specific mechanisms are well known and are thus not shown, for instance, as in luggage belts in certain airports. As the belt is caused to move counterclockwise, the superconducting elements each enter and exit different regions of the cycle. In the left semicircle the moving elements come in thermal contact with the HHEX 33' and in the right semicircle with the CHEX 34'. On the bottom side of the track and in good thermal contact with the superconducting elements' (via the thermally conductive mount plates) a recuperative heat exchanging flow 35' is mounted whose fluid is pumped in a direction opposing the direction of movement of the superconducting element, i.e. a clockwise flow.

A magnetic field generating structure 36', enclosing the rightmost semicircle and straight top of the "race track", consists of a segment of a toroidally wound superconductor generating a strong and mostly homogeneous field within it. In order to control the field intensity at the entrance and exit of the field, as well as screen the residual field from the leftmost semicircle and bottom linear part of the race track, a superconducting screen 37', with hollows allowing the movement of the superconductor elements, is provided. Screen 37' forces the completion of the magnetic circuit between it and the external inner part of the toroid structure. By chosing the screen's geometry and position one may control the rate of field intensity decrease at the entrance and exit of the toroid and thus a better match of field changes and rate of heat exchanging is obtained. An additional control is the rate of movement of the belt carrying the superconductor.

The operation of this embodiment shown in FIG. 20 is similar to those described above. Referring to FIGS. 2C and 20, a superconducting element exiting the left most semicircle in FIG. 20 (point A in FIG. 2C), is moving counterclockwise, and is at $T_2$. As it moves along the lower linear track, it contacts a recuperative heat exchanger 35', while in an essentially nil magnetic field, which absorbs heat from the element 3e' and in the process lowers its temperature to $T_1$, or point B in FIG. 2C. The element now enters a progressively increasing magnetic field in the rightmost semicircle and comes in contact with the CHEX 34', where it isothermally picks up heat form the CHEX 34', which allows for the isothermal decoupling of the superconductors' charge carriers pairs. When complete quenching of the superconductor occurs, at point C in FIG. 2C and at the end of the rightmost semicircle, the superconducting element contacts the recuperative counter-flowing heat exchanger 35', and is warmed to $T_2$, in the presence of the high magnetic field, in the top linear part of the track, or point D in FIG. 2C. The cycle is completed as the field gradually declines to nil within the left most semicircle, and the superconducting element returns to its superconducting state, while discharging isothermally to the HHEX 33', the pairing energies of its charge carriers, and returning to point A in FIG. 2C.

Figures 21A, 21B:
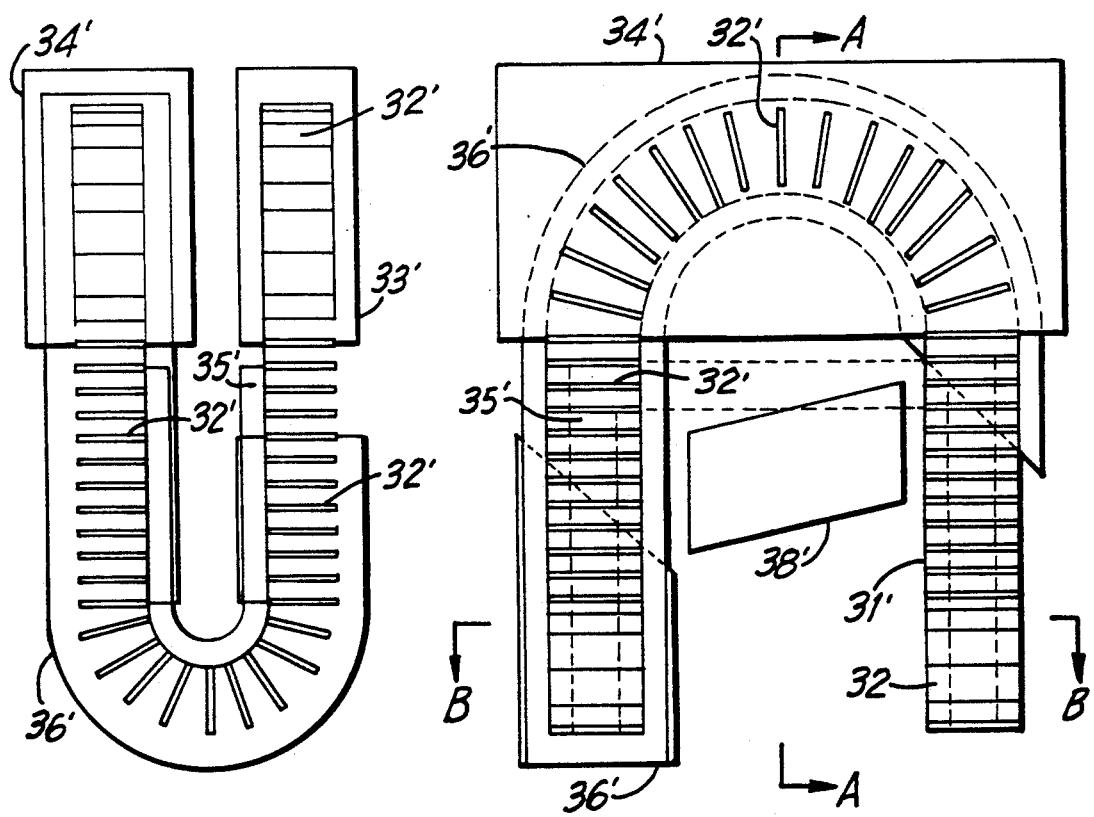

A variant of this device is obtained by bending the racetrack-like structure, described in FIG. 20, around the axis B shown in FIG. 20. The resulting device is shown schematically in FIG. 21A, and a side view through the axis A is shown in FIG. 21B. Because of the relative proximity of the open ends of the distorted toroid segment 36', which forms the desired magnetic field, the magnetic flux lines circuit is closed with device 38' (in lieu of the superconducting screen 37' in FIG. 20). This device may be of appropriately shaped soft iron, which due to magnetic induction saturation would limit the field available within the toroidal structure to about 2 Tesla. Nevertheless, it would limit stray fields in parts of the device where nil or very low fields are desired. Alternatively, after the toroid has been powered, one can uses semicylindrical elements of a superconducting substances, and mechanically brace them together, to trap the magnetic field within the hollow. By shaping (flaring) the extremities of the two opposing semicylinders appropriately, one can better control the intensity of the fields at the entry and exit of the toroid segment to match the required field rate of change to the dynamics of heat exchanging in the system. The operation of this device parallels the description given above. Rotating the device shown in FIGS. 21A and 21B' by 180°, brings the heat exchangers to the bottom. The heat exchangers may be fluid containers with sliding seals to avoid excessive fluid loss and thus provide better heat exchanging with the superconducting elements.

In practice the difference between Ericcson and Brayton based heat pumps is often blurred due to the difficulty in obtaining pure adiabatic magnetization and demagnetization of the WSM, in the Brayton devices, and the difficulty in keeping the isothermal paths in the Ericcson devices purely isothermal. The first difficulty arises from trying to completely isolate thermally the WSM from the environment, which may not be completely successful. The second difficulty is due to the need, in finite temperature differences between the WSM and the CHEX and HHEX respectively, to allow for heat transfer.

Regenerative Heat Exchange In A Superconductor Heat Pump

In yet another embodiment of the present invention, the Working Superconducting Medium (WSM) is in the form of a loosely packed bed of superconducting particles. For example the particles are 1-2-3ceramic pellets of 0.5-3 mm diameter. A magnetic field is applied and withdrawn, sequentially, and a heat exchanging fluid (liquid or gas) is shuttled back and forth between hot and cold heat exchangers. A device employing a bed of paramagnetic particles is known in the prior art as an Active Magnetic Regenerative Refrigerator (J. A. Barclay, Proc. 2nd Conf. of Refrigeration for Cryogenic Sensor and Electronic Systems, NASA' Goddard Research Center, 1982), incorporated by reference herein, and operates on the magnetocaloric effect.

An embodiment of this superconductor based magnetic heat pump will be better understood by examining FIGS. 22 A and 22 B. FIG. 22 A shows a tubular structure 40, containing loosely packed particles of a high temperature Type II superconductor. The particles are generally spherical and of relatively large diameter (preferably larger than 0.5 mm in diameter) to allow easy flow of the heat exchanging fluid or gas. The upper limit on the particle size is determined by the flow rate of the heat exchanging fluid and the thermal conductivity of the superconductor, to assure good heat transfer between the particles and the fluid, and in general should not exceed 1 cm.

The tubular structure 40 is terminated on opposite sides with appropriate sieves (not shown) to contain the particles within the structure but allow free passage of the heat exchanging fluid. The tubular structure is connected on opposing sides to hollow cold and hot reservoirs 42 and 43 respectively containing the heat exchanging fluid. The tubular structure 40 containing the superconducting particles is within a structure 44 which applies a magnetic field on the particles. This structure 44 may be a fixed magnet or an electromagnet having the tubular structure 40 within its pole gap, and movable relative to the tubular structure 40. An alternative design uses a solenoid that is powered on and off to obtain the changes in magnetic field.

The cold reservoir 42 and the hot reservoir 43, contain respective pistons 45 and 46, that move in tandem with each other. The pistons 45, 46 force the heat exchanging fluid 47 through the bed of superconducting particles 41. The cold reservoir 42 is in intimate contact with the cold heat exchanger 48 (load) at temperature $T_1$, while the hot reservoir 43 is in intimate contact with the hot heat exchanger 49 which is at temperature $T_2$.

The operation of the device is as follows. With most of the heat exchanging fluid 47 in the hot reservoir 43, as in FIG. 22 A, the magnetic field is applied to the superconducting particles 42 in the tubular structure 40. As a result of the (adiabatic) application of the magnetic field, the particles' temperature decreases. Now the piston 46 is moved to the right (in tandem with the piston 45), while the magnetic field is still applied, and as a result the fluid's temperature is decreased. When the pistons 45 and 46 have reached the position depicted in FIG. 22 B, the magnetic field is discontinued (either by moving the magnet away or switching the current off in the field generating structure) adiabatically, and as a result the particles' temperature increases. The piston 45 and 46 are now moved back to their original position and the heat exchanging fluid extracts the heat from the particles on the way to hot reservoir, where the heat is discharged.

Figure 23:
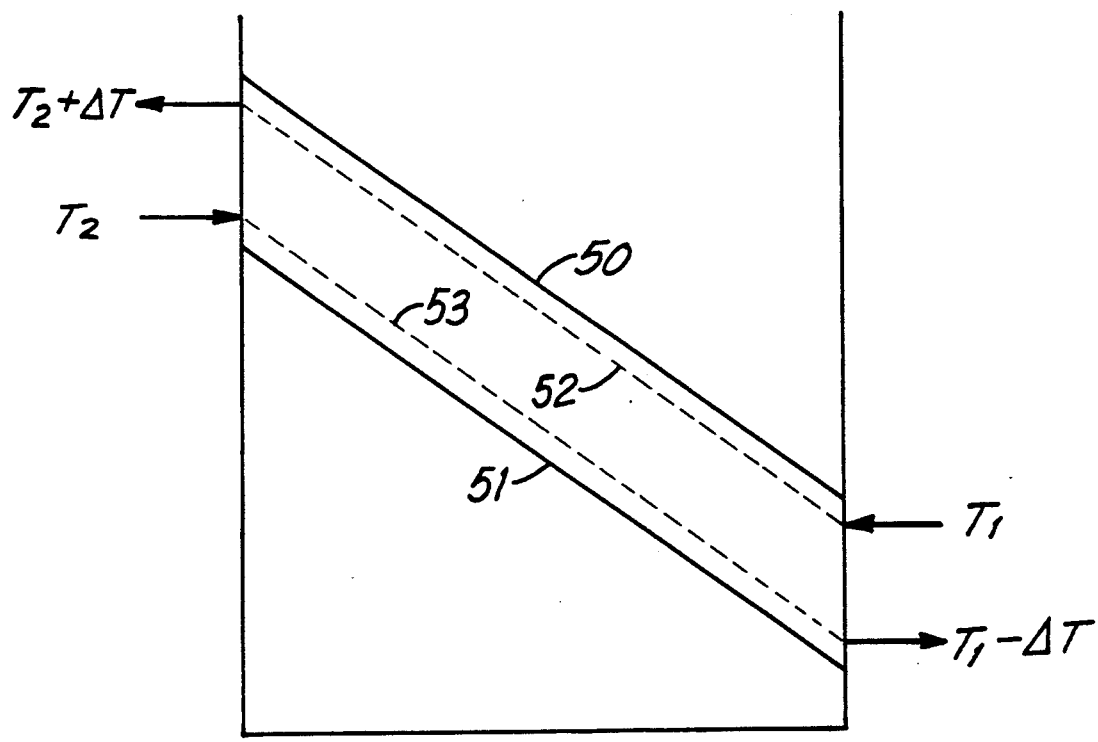
FIG. 23 is a T vs. S graph of the fluid-device.

In practice, when the device is started, the two reservoirs are at the high temperature $T_2$. As the device is operated, the high temperature reservoir is kept at $T_2$, for instance, by contact with a liquid nitrogen source. As the device is operated, a steady state temperature gradient is established as described in FIG. 23. FIG. 23 shows the steady state temperature distribution within the bed of superconducting particles and the temperature distribution of the exchanging fluid as a function of the position within the superconducting particles' bed. The solid line 50 depicts the superconducting particles bed's temperature profile after adiabatic demagnetization and the solid line 51 depicts the lower temperature distribution due to adiabatic magnetization of the bed. The broken line 52 depicts the fluid heat exchanging medium's temperature profile as it moves from the cold heat exchanger to the hot heat exchanger after adiabatic demagnetization of the bed, while the broken line 53 depicts the fluid heat exchanging medium's temperature as it moves from the hot reservoir to the cold reservoir after adiabatic magnetization of the bed. The heat exchanging fluid 47 leaves the hot reservoir 43 at a temperature $T_2$, since it is in equilibrium with the hot heat exchanger 49. It meets the superconducting particles whose temperature was lowered due to adiabatic magnetization. As the heat exchanging fluid 47 moves deeper into the particle bed its temperature decreases, until it reaches the right end of the bed and comes into contact with the cold heat exchanger 48. At this point, the heat exchanging fluid reaches a temperature $T_1$ -Delta T, which is under the temperature of the cold heat exchanger 48. The cold heat exchanger 48 raises the temperature of the heat exchanging fluid 47 to $T_1$, and the particle bed is adiabatically demagnetized. As a exchanging fluid 47 is shuttled back to the left of the bed, absorbing heat from the bed along the way and exits the bed at a temperature $T_2$ +Delta T. Since the hot reservoir 41 is at temperature $T_2$, the heat exchanging fluid is cooled to $T_2$, prior to repeating of the cycle.

The thermodynamic nature of the cycle employed is an approximation of the Carnot cycle at each point of the particle bed. These micro Carnot cycles are staged on upon the other with the help of the heat exchanging fluid.

The four lines in FIG. 23 are drawn as straight lines, but in practice, when using a single superconducting substance for the particle bed and a uniform magnetic field, these lines are somewhat curved (and the system's thermodynamic efficiency somewhat negatively impacted). The reason for these curves is that the superconductor's entropy differences between the magnetized and unmagnetized states is a function of the temperature.

In order to improve the heat pump efficiency, one can use a graded magnetic field that will compensate for the temperature differences as a function of temperature (since the entropy within the mixed state is a function of the magnetic field). One can also use a segmented bed, in which at the low temperature part of the bed there is used a less refractory superconductor (with a lower critical temperature and critical fields) while at the high temperature position of the bed there is used a more refractory superconductor. Such a heat pump employs superconductors having critical temperatures below the hot reservoir temperature near the cold reservoir end of the bed. Such different superconductors may be separated by sieves inserted between them when packing the bed. At each location in the bed however, the critical temperature of the superconducting particles should be above the target temperature of that superconductor in the bed.

When a segmented bed is used, having superconductors with critical temperatures lower than the hot reservoir (at the cold reservoir end of the bed), the establishment of a steady state temperature distribution as in FIG. 23 takes longer then with a bed with a refractory superconductor in the entire bed. This is because only the part of the bed that has cooled under the critical temperature participates in the refrigeration process. At the beginning of the operation the bed is at $T_2$ and application of the magnetic field will cause lowering of the temperature of the refractory superconductors (near the hot reservoir end of the bed), which will cool the heat exchanging fluid, which in turn will gradually cool the less refractory parts of the bed below their respective critical temperatures.

In the practice of the heat pump described in FIGS. 22 A and 22 B, one can obtain a better rate of heat exchange between the shuttling heat exchanger 47, and the hot and cold heat exchangers (49 and 48 respectively) by forming the heat exchangers with perforations to allow fluid passage in proximity with the superconducting beds within the heat exchanging fluid containers 43 and 42.

In the practice of the instant invention, it is preferred to use isotropic polycrystalline superconductors (having the crystallites oriented randomly in the superconductor) for a number of reasons. First, the critical fields of isotropic polycrystalline high temperature superconductors are appreciably lower than those of well oriented single crystals or anisotropic (in which all, or almost all grains are alligned in a single direction) polycrystalline superconductors. Second, with isotropic superconductors the direction of application of the magnetic field relative to the superconductor is irrelevant, while in well oriented superconductors, the direction of application of the field relative to the "C" axis of the crystal has a major impact on the extent of quenching that is achieved.

The terms recuperation and regeneration refer to heat exchange processes which exhibit time independent, and time dependent, behavior respectively. In each case a thermal gradient exists across the heat exchanger. A counterflow and a packed bed heat exchanger are examples of recuperative and regenerative devices, respectively.

In the Brayton (and Ericcson) devices described above, the counterflow heat exchanger is one device (i.e, in FIG. 14, the device consisting of the elements 36, 40, 39 and 41 in which a single heat exchanging fluid flows) and it is a recuperative heat exchanger.

What is claimed is:

1. A heat pump system operative by the inverse magnetocaloric effect and including:
   (a) a working medium comprising a superconductive body of high temperature type II superconductive material having a critical temperature above 23° K. an having paired charge carriers;
   (b) magnet means to produce a magnetic field sufficient to decrease the concentration of paired charge carriers of the superconductive body and to thereby induce cooling and/or absorb heat of said body when the superconductor body is below said critical temperature but insufficient to quench the superconductive body to a normal non-conductive state;
   (c) a hot heat exchange means to remove heat from said superconductive body;
   (d) a cold heat exchange means from which heat is removed by said superconductive body; and
   (e) magnetic field change means to repeatedly bring said superconductive body into and out of said magnetic field to reversibly change the concentration of said paired charge carriers of the superconductive body without elimination of all paired charge carriers; and
   (f) motor means to bring said body in sequential thermal conductive contact with said hot heat exchange means and said cold heat exchange means.

2. A Carnot Cycle magnetic heat pump system operative by the inverse magnetocaloric effect and including:
   (a) a working medium comprising a superconductive body of high temperature type II superconductive material having a critical temperature above 23° K. and having paired charge carriers;
   (b) magnet means having at least two magnetic fields each sufficient to decrease the concentration of paired charge carriers of the superconductive body and to thereby induce cooling thereof when the superconductor body is below said critical temperature but insufficient to quench the superconductive body to a normal non-superconductive state;
   (c) a hot heat exchange means to remove heat from said superconductive body;
   (d) a cold heat exchange means to be cooled by said superconductive body; and
   (e) magnetic/field change means to repeatedly bring said superconductive body into and out of said magnet fields to reversibly change the concentration of the paired charge carriers of the superconductive body by application and withdrawal of said magnet fields relative to said body without elimination of all paired charge carriers; and
   (f) motor means to bring said superconductive body in sequential thermal conductive contact with said hot heat exchange means and said cold heat exchange means in two adiabatic and two isothermic steps.

3. A Brayton Cycle magnetic heat pump system operative by the inverse magnetocaloric effect and including:
   (a) a working medium comprising a superconductive body of high temperature type II superconductive material having a critical temperature above 23° K. and having paired charge carriers;
   (b) magnet means having a magnetic field sufficient to decrease the concentration of the paired charge carriers of the superconductive body and to thereby induce cooling and/or absorb heat therein when the superconductor body is below said critical temperature but insufficient to quench the superconductive body to a normal non-superconductive state;
   (c) a hot heat exchange mean to remove heat from said superconductive body;
   (d) a cold heat exchange means to be cooled by said superconductive body;
   (e) a counterflowing recuperative heat exchange means to heat and to cool the superconductive body;
   (f) magnetic field change means to repeatedly bring said superconductive body adiabatically into and out of the magnetic field of said magnet means to reversibly change the concentration of said paired charge carriers of the superconductive body without elimination of all paired charge carriers; and
   (g) motor means to repeatedly bring said superconductive body in sequential thermal conductive contact with said cold heat exchange means and then with said recuperative heat exchange means within the high constant magnetic field, and then with the said hot heat exchange means and then with the recuperative heat exchange means within the low or nil magnetic field, essentially in two isentropic and two isomagnetic steps.

4. An Ericcson Cycle magnetic heat pump system operative by the inverse magnetocaloric effect and including:
   (a) a working medium comprising a superconductive body of high temperature type II superconductive material having a critical temperature above 23° K. and having paired charge carriers;
   (b) magnetic means having a magnetic field sufficient to decrease the concentration of the paired charge carriers of the superconductive body and to thereby induce cooling and/or absorb heat therein when the superconductive body is below said critical temperature but insufficient to quench the superconductive body to a normal non-superconductive state;
   (c) a hot heat exchange means to remove heat from said superconductive body;
   (d) a cold heat exchange means to be cooled by said superconductive body;
   (e) magnetic field change means to repeatedly bring said superconductive body into and out of the magnetic field of said magnet means to reversibly change the concentration of said paired charge carriers of the superconductive body without elimination of all paired charge carriers; and
   (f) motor means to repeatedly bring said superconductive body in sequential thermal conductive contact with said cold heat exchange means and then with said recuperative heat exchange means and then with the said hot heat exchange means and then with the recuperative heat exchange means in essentially two isothermal and two isomagnetic steps.

5. A heat pump system as in claims 1, 2, 3 or 4 wherein said superconductor is a 1-2-3 ceramic material.

6. A heat pump system as in claims 1, 2, 3 or 4 and further including at least segments of a superconductive solenoid and wherein said magnetic field is generated by said superconductive solenoid.

7. A heat pump system as in claims 1, 2, 3 or 4 wherein the superconductive body is in a sliding low-friction high thermal conductive contact with the cold heat exchange means and the hot heat exchange means during said contacts.

8. A heat pump system as in claims 1, 2, 3 or 4 wherein said magnetic field change means moves said superconductive body relative to said magnet means in straight-line reciprocal motion.

9. A heat pump system as in claims 1, 2, 3 or 4 wherein said magnetic field change means moves said superconductive body relative to said magnet means by rotary motion of said superconductive body relative to said magnet means.

10. A heat pump system as in claims 1, 2, or 4 wherein said magnetic means includes a plurality of magnetic fields of different strengths and includes a superconductive cylinder positioned adjacent to at least one of said magnetic fields.

11. A heat pump system as in claims 1 or 2 and including a rotatable disk, said motor means rotates the disk, and the magnetic means is mounted on the disk.

12. A heat pump system as in claims 1, 2 or 4 wherein said magnetic means includes a plurality of magnetic fields and a superconductive shield means to screen strong fields and form a relatively low strength magnetic field.

13. A heat pump system as in claim 2 wherein said superconductive body comprises a plurality of separated superconductive members; the motor means includes a rotatable disk upon which said superconductive members are mounted, the cold heat exchange means is positioned centrally relative to said disk and the hot heat exchange means is positioned at the periphery of said disk.

14. A heat pump system as in claim 2 wherein said motor means includes a rotatable disk, said magnetic means is mounted on said disk and said working medium, hot heat exchange means and cold exchange means are stationary relative to said disk.

15. A heat pump system as in claim 2 wherein said motor means includes a rotatable disk and said superconductor body is mounted on said disk.

16. A heat pump system as in claim 15 wherein said magnetic means is stationary.

17. A heat pump system as in claim 15 and including a second rotatable disk, said magnetic means is mounted on said second disk and said motor means includes means to rotate said two disks in opposite rotational movement.

18. A heat pump system as in claim 1, 2, 3 or 4 wherein said magnet means includes a plurality of permanent magnets.

19. A heat pump system as in claim 1, 2, 3 or 4 wherein said magnet means includes a plurality of electromagnetics.

20. A heat pump system as in claim 1, 2, 3 or 4 wherein said magnet means includes a plurality of superconducting electromagnets.

21. A heat pump system as in claim 1, 2, 3 or 4 wherein said magnet means is fixed and said superconductive body is moved relative to said magnet means.

22. A heat pump system as in claim 1, 2, 3 or 4 wherein said superconductive body is fixed and said magnet means is moved relative to said body.

23. A heat pump system as in claims 1, 2, 3 or 4 wherein said two heat exchange means are fixed and both said magnet means and said superconductive body are moved.

24. A Brayton heat pump system as in claim 3 wherein said superconductive body comprises a plurality of separated members, the motor means includes a ring and means to rotate the ring in one direction, said superconductive members are mounted on the ring, the magnet means is stationary and the system includes a fluid pump and a recuperative heat exchanger including a fluid path in which heat exchange fluid is pumped by said pump in a direction counter to the direction of rotation of the ring.

25. A heat pump system as in claim 24 wherein said hot heat exchange means and said cold heat exchange means each include hollow tubes through which heat exchange media is pumped.

26. A heat pump system as in claims 1 or 3 wherein said magnetic means and said superconductive body are both moved in an orthogonal and reciprocating relative motion.

27. A heat pump system as in claim 26 wherein said two heat exchange means are stationary and said system includes a recuperative counter flow heat exchanger.

28. A heat pump system as in claims 1 or 3 wherein said motor means includes means to move the superconductive body and the two heat exchange means and to move said superconductive body in reciprocal and orthogonal movement relative to said two heat exchange means.

29. A heat pump system as in claims 1, 2, 3 or 4 wherein said superconductive body is selected from the group comprising $Y_1 Ba_2 Cu_3 O_7$ and Bi—Sr—Ca—Cu—O and Tl—Ba—Ca—Cu—O.

30. A heat pump system as in claims 1, 2, 3 or 4 wherein the magnet means includes a plurality of magnets and each pair of said magnets includes an iron yoke.

31. A heat pump system as in claim 4 including a race-track-like structure.

32. A heat pump system as in claim 31 wherein said race-track-like structure is bent over to form two half-connected half-race-track structures.

33. A heat pump system as in claims 1, 2, 3 or 4 wherein the magnet field change means includes movement means to move said superconductor body relative to said magnet means.

34. A heat pump system as in claims 1, 2, 3 or 4 wherein said magnetic field change means includes switch means to switch said magnetic field or fields off and on.

35. A heat pump system as in claim 1 wherein said superconductor body comprises a packed bed of superconductor particles, said magnet field change means includes switch means to switch said magnetic field off and on and said motor means moves a fluid through said packed bed in said sequence to establish said thermal conductive contacts.

36. The method of transferring heat from a cold reservoir to a hot reservoir at a relatively higher temperature in order to cool said cold reservoir by cooling a type II high temperature superconductor body having a critical temperature above 23° K. to below the critical temperature of the superconductor body and then, in a repeated sequence, adiabatically imposing on said body at least one magnetic field without quenching the superconductor body to a normal non-superconductive state to adiabatically lower the temperature of said body, and adiabatically withdrawing the magnetic field from said body to adiabatically raise the temperature of said body.

37. The method of transferring heat from a cold reservoir to a hot reservoir at a relatively higher temperature in order to cool said cold reservoir by cooling a type II high temperature (about 28° K.) superconductor body to below its critical temperature and then, in a repeated sequence, imposing on said body at least one magnetic field without quenching the superconductor body to a normal non-superconductive state to isothermally absorb heat from said cold reservoir, and withdrawing the magnetic field from said body to isothermally exude heat to said hot reservoir.

38. The method of transferring heat from a cold reservoir to a hot reservoir at a relatively higher temperature in order to cool said cold reservoir by cooling a type II high temperature superconductor body having a critical temperature above 23° K. to below the critical temperature of the superconductor body and then, in a repeated sequence, lowering the superconductor body temeprature with a recuperative heat exchanger isomagnetically under a low or nil magnetic field and then raising the superconductor body temeprature with a recuperative heat exchanger isomagnetically under a higher magnetic field.

39. The method of transferring heat from a cold reservoir to a hot reservoir as in claim 36 or 37 wherein the sequence consists of:
(a) moving said superconductor body into thermal contact with the hot reservoir at a temperature $T_2$ in a low magnetic field $H_0$;
(b) rapidly and adiabatically moving said superconductor body into a higher magnetic field $H_2$ thus causing adiabatic cooling of the superconductor body to a temperature $T_1$, which is the temperature of the said cold reservoir;
(c) moving said superconductor body while in thermal contact with the cold reservoir through progressively higher magnetic fields to a maximal field $H_3$ to draw heat isothermally from the cold reservoir;
(d) rapidly and adiabatically moving the superconductor body into a field $H_1$ which is a weaker field than $H_2$, causing adiabatic demagnetization warming of said superconductor body to temperature $T_2$, the temperature of the hot reservoir;
(e) moving said superconductor body while in contact with the hot reservoir through progressively lower magnetic fields to the lowest field $H_0$ to exude heat from the said superconductor body to the hot reservoir; and
(f) repeating steps a-e cyclically to transfer heat from the cold reservoir to the hot reservoir.

40. The method as in claim 39 wherein $H_0$ is about zero.

41. The method as in claim 39 where $H_2 = H_1$.

42. The method as in claim 39 where the magnetic induction B in the said superconductor body obeys $B_2 = B_1$ under the respective fields $H_2 > H_1$.

43. A method of transferring heat from a cold reservoir to a hot reservoir as in claims 36 or 38 wherein the sequence consists of:
(a) making thermal contact of the superconductor body with a recuperative heat exchanger having a flow of fluid therethrough with the lowest temperature of the heat exchanger essentially at $T_1$;
(b) applying a large magnetic field H to the superconductor body to cool said body to $T_1$-Delta T by adiabatic magnetization cooling;
(c) moving the superconductor body into contact with the cold reservoir at temperature $T_1$ and warming said body to $T_1$;
(d) raising said body temperature to $T_2$ while in the magnetic field H by moving said body into contact with the recuperative heat exchanger having a temperature gradient $T_1$ to $T_2$;
(e) withdrawing said body from the applied magnetic field H, to raise said body's temperature to $T_2$+Delta T by adiabatic demagnetization warming;
(f) moving said body into contact with the hot reservoir at temperature $T_2$ to exude heat to the hot reservoir and cool said body to $T_2$;
moving the body into contact with the recuperative heat
exchanger having a temperature gradient $T_2$ to $T_1$ to lower said body temperature to $T_1$; and
(h) repeating steps a through g cyclically to transfer heat from the cold reservoir to the hot reservoir.

44. A method of transferring heat from a cold reservoir to a hot reservoir as in claims 36 or 38 wherein the sequence consists of:
(a) bringing the superconductor body into thermal contact with a recuperative heat exchanger having a fluid flow therethrough with the highest temperature of the heat exchanger essentially at $T_2$;
(b) lowering the temperature of said body from $T_2$ to $T_1$ in an essentially nil magnetic field by moving said body into contact with said recuperative heat exchanger having a temperature gradient $T_2$ to $T_1$;
(c) moving said body into contact with the cold reservoir in progressively increasing magnetic fields and absorbing heat from said reservoir by isothermal decoupling of paired charge carriers;
(d) raising the temperature of said body from $T_1$ to $T_2$ isomagnetically in the presence of the highest magnetic field by moving said body into contact with said recuperative heat exchanger having a temperature gradient $T_1$ to $T_2$;
(e) moving said body into contact with the hot reservoir in progressively decreasing magnetic fields and exuding heat to said reservoir by isothermal recoupling of charge carriers; and
(f) repeating a to e cyclically to transfer heat from the cold reservoir to the hot reservoir.

45. The method of operating a heat pump system using the inverse magnetocaloric effect in which the heat pump includes:
(a) a working medium comprising a superconductor body of high temperature type II superconductive material having a critical temperature above 23° K. and having paired charge carriers;
(b) magnet means to generate a magnetic field sufficient to decrease the concentration of paired charge carriers at the superconductor body and to thereby induce cooling and/or absorb heat of said body when the superconductor body is below said critical temperature but insufficient to quench the superconductive body to a normal non-superconductive state;
(c) a hot heat exchange means to remove heat from said superconductor body;

(d) a cold heat exchange means from which heat is removed by said superconductor body; and (e) motor means;

said method including the step of repeatedly moving said superconductive body relative to said magnet means to reversibly change the concentration of said paired charge carriers of the superconductive body and to bring said body in repeated and sequential thermal conductive contact with said hot heat exchange means and said cold heat exchange means.

46. The method of operating a Carnot Cycle magnetic heat pump system using the inverse magnetocaloric effect, in which the heat pump includes:

(a) a working medium comprising a superconductor body of high temperature type II superconductive material having a critical temeprature above 23° K. and having paired charge carriers;

(b) magnet means having a magnetic field sufficient to decrease the concentration of paired charge carriers of the superconductor body and to thereby induce cooling thereof when the superconductor body is below said critical temperature but insufficient to quench the superconductive body to a normal non-superconductive state;

(c) a hot heat exchange means to remove heat from said superconductor body;

(d) a cold heat exchange means to be cooled by said superconductor body; and (e) motor means;

said method including the step of operating said motor means to repeatedly move said superconductive body relative to said magnet means to reversibly change the concentration of the paired charge carriers of the superconductive body without elimination of all paired charge carriers and to bring said superconductive body in sequential thermal conductive contact with said hot heat exchange means and said cold heat exchange means in a repeated sequence of two adiabatic and two isothermic steps without quenching the superconductor body to a normal non-superconductive state.

47. The method of operating a Brayton Cycle magnet heat pump system using the inverse magnetocaloric effect, in which the heat pump includes:

(a) a working medium comprising a superconductor body of high temperature type II superconductive material having a critical temperature above 23° K. and having paired charge carriers;

(b) magnet means having a magnetic field sufficient to decrease the concentration of the paired charge carriers of the superconductor body and to thereby induce cooling and/or absorb heat therein when the superconductor body is below said critical temperature but insufficient to quench the superconductive body to a normal non-superconductive state;

(c) a hot heat exchange means to remove heat from said superconductor body;

(d) a cold heat exchange means to be cooled by said superconductor body;

(e) motor means; and (f) a recuperative hot heat exchanger means having two opposing thermal gradient portions one portion positioned within the magnetic field and one portion positioned outside the magnetic field, to heat and to cool the body respectively, and the process includes the steps of:

(g) using said motor means to repeatedly bring said superconductive body into and out of the magnetic field of said magnet means to change the concentration of said paired charge carriers of the superconductive body without elimination of all paired charge carriers and to repeatedly bring said superconductive body in sequential thermal conductive contact with said heat exchange means and then said recuperative heat exchange means; then with said cold heat exchange means; and then with said recuperative heat exchange means;

(h) flowing a fluid n the direction counter to the direction of movement of said body to maintain a positive temperature gradient in said recuperative heat exchange means portion within the magnetic field and a negative temperature gradient in said recuperative heat exchange means portion outside of the magnetic field.

48. A method as in claims 36, 37, 38 45, 46 or 47 wherein said superconductor is a 1-2-3 ceramic material.

49. A method as in claims 36, 37, 38 45, 46 or 47 and including the step of generating said magnetic field using a superconductive solenoid.

50. A method as in claims 36, 37, 38 45, 46 or 47 and including the step of contacting the superconductor body in a sliding low-friction high thermal conductive contact with the cold heat exchange means and then the hot heat exchange means.

51. A method as in claims 45, 46 or 47 wherein said motor operation moves said superconductor body relative to said magnetic means in a straight-line reciprocal motion.

52. A method as in claims 45, 46 or 47 wherein said motor operation moves said superconductor body relative to said magnetic means by rotary motion of one of said superconductor body and said magnet means.

* * * * *